(12) United States Patent
Takahashi et al.

(10) Patent No.: US 8,906,792 B2
(45) Date of Patent: Dec. 9, 2014

(54) IMPURITY DIFFUSION METHOD, SUBSTRATE PROCESSING APPARATUS, AND METHOD OF MANUFACTURING SEMICONDUCTOR DEVICE

(71) Applicant: Tokyo Electron Limited, Tokyo (JP)

(72) Inventors: Kazuya Takahashi, Nirasaki (JP); Yoshikazu Furusawa, Nirasaki (JP); Mitsuhiro Okada, Nirasaki (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 13/871,297

(22) Filed: Apr. 26, 2013

(65) Prior Publication Data

US 2013/0288470 A1 Oct. 31, 2013

(30) Foreign Application Priority Data

Apr. 27, 2012 (JP) ................. 2012-103767

(51) Int. Cl.
*H01L 21/22* (2006.01)
*H01L 21/223* (2006.01)
*H01L 21/28* (2006.01)

(52) U.S. Cl.
CPC ...... *H01L 21/2236* (2013.01); *H01L 21/28035* (2013.01)
USPC .......................................... 438/565; 438/566

(58) Field of Classification Search
CPC .............. H01L 21/223; H01L 21/2236; H01L 21/28035
USPC .......... 438/392, 418–439, 565; 257/E21.135, 257/751, 767, 657, 927, E29.277–E29.279, 257/E21.466–E29.469
See application file for complete search history.

(56) References Cited

U.S. PATENT DOCUMENTS

| | | | |
|---|---|---|---|
| 6,624,049 B1* | 9/2003 | Yamazaki | 438/476 |
| 2004/0211999 A1* | 10/2004 | Yamamoto et al. | 257/296 |
| 2007/0295396 A1* | 12/2007 | Takahashi et al. | 136/256 |
| 2008/0245303 A1* | 10/2008 | Yamamoto | 118/725 |
| 2008/0280420 A1* | 11/2008 | Yamazaki | 438/458 |
| 2010/0297832 A1* | 11/2010 | Imai et al. | 438/478 |
| 2011/0237076 A1* | 9/2011 | Narushima | 438/685 |
| 2012/0312235 A1* | 12/2012 | Yamamoto | 118/725 |
| 2013/0270555 A1* | 10/2013 | Okazaki et al. | 257/43 |

FOREIGN PATENT DOCUMENTS

| | | |
|---|---|---|
| JP | 63166220 | 7/1988 |
| JP | 63226920 | 9/1988 |
| JP | 05074727 | 3/1993 |
| JP | 05152235 | 6/1993 |
| JP | 10022396 | 1/1998 |
| JP | 2006024758 | 1/2006 |
| JP | 2008053605 | 3/2008 |

* cited by examiner

*Primary Examiner* — Amar Movva
*Assistant Examiner* — Sheikh Maruf
(74) *Attorney, Agent, or Firm* — Cantor Colburn LLP

(57) ABSTRACT

The impurity diffusion method includes: transferring an object on which the thin film is formed into a processing chamber (operation 1); raising a temperature of the object to a vapor diffusion temperature in the processing chamber (operation 3); and supplying an impurity-containing gas that contains the impurities into the processing chamber, together with an inert gas and diffusing the impurities in the thin film formed on the object of which the temperature is raised to the vapor diffusion temperature (operation 4), wherein in the operation 4, an impurity diffusion acceleration gas for accelerating the diffusion of the impurities into the thin film is supplied into the processing chamber, together with the impurity-containing gas and the inert gas.

14 Claims, 29 Drawing Sheets

IMPURITY DIFFUSION METHOD, SUBSTRATE PROCESSING APPARATUS, AND METHOD OF MANUFACTURING SEMICONDUCTOR DEVICE

CROSS-REFERENCE TO RELATED PATENT APPLICATIONS

This application claims the benefit of Japanese Patent Application No. 2012-103767, filed on Apr. 27, 2012, in the Japan Patent Office, the disclosure of which is incorporated herein in its entirety by reference.

BACKGROUND OF THE INVENTION

1. Field of the Invention

The present invention relates to an impurity diffusion method, a substrate processing apparatus, and a method of manufacturing a semiconductor device.

2. Description of the Related Art

A transistor functions as an active device in a semiconductor device. Recently, many of highly integrated semiconductor devices have mounted therein a field effect transistor, for example, a metal oxide semiconductor field effect transistor (MOSFET), including a gate electrode for controlling turning-on/turning-off.

A gate electrode is formed by using a conductive material, and one of important factors with respect to the gate electrode is a work function thereof. Unless the work function of the gate electrode is controlled, a threshold value, for example, of the transistor may exceed a designed range, and thus, normal operations may not be performed.

If a gate electrode is formed by using polysilicon or amorphous silicon, a work function of the gate electrode is controlled by controlling an amount of a donor or accepter, which is so-called impurities, doped on the polysilicon or the amorphous silicon. Also, the amount of impurities doped on the polysilicon or the amorphous silicon affects a resistance value of the gate electrode.

As described above, since the amount of the doped impurities affects the work function and the resistance value of the gate electrode, the amount has to be strictly controlled. A technology of growing a film on which impurities are doped is disclosed in, for example, Patent Document 1.

In Patent Document 1, a surface of a substrate, that is, $Si_{1-x}Ge_x(100)$, is cleaned under a hydrogen atmosphere, and after that, a $BCl_3$ gas is supplied with an inert gas that is $H_2$ gas to grow a boron (B) layer of about one atomic layer thickness or less on the surface of the substrate. Then, a mixture gas of $SiH_4$—$GeH_4$—$H_2$ is supplied to epitaxially grow a $Si_{1-x}Ge_x$ layer of a few to hundreds of nm.

In Patent Document 1, by repeatedly performing the growth of the B layer and the epitaxial growth of the $Si_{1-x}Ge_x$ layer, the $Si_{1-x}Ge_x$ layer on which boron, that is, an acceptor, is doped at a high concentration may be epitaxially grown on the surface of the substrate (for example, refer to paragraphs No. 0036 to 0040).

As described above, since the amount of the impurities doped on the polysilicon or the amorphous silicon forming the gate electrode affects the work function and the resistance value of the gate electrode, the amount of the impurities has to be strictly controlled.

Recently, along with the miniaturization of transistors, variations in the work function and the resistance value of the gate electrode caused by the impurities that are lost during surface oxidation or an etching process of the gate electrode have greatly increased, wherein the variations have not been apparent so far due to being excessively fine.

In order to compensate for the impurities lost during the surface oxidation or the etching process, it has suggested that impurities of a vapor phase are diffused toward the polysilicon or the amorphous silicon. However, it takes a long time by using vapor diffusion to diffuse the impurities to a high concentration. Thus, there is concern about degradation of throughput.

Also, Patent Document 1 discloses an epitaxial growth of a $Si_{1-x}Ge_x$ layer on which boron of a high concentration is doped. However, Patent Document 1 only discloses the $Si_{1-x}Ge_x$ layer doped with the high concentration boron, but does not teach a technology of compensating for lost impurities.

(Patent Document 1) Japanese Laid-open Patent Publication No. 2008-53605

SUMMARY OF THE INVENTION

The present invention provides an impurity diffusion method capable of performing vapor diffusion of impurities at a higher concentration within a shorter period of time, a substrate processing apparatus capable of executing the impurity diffusion method, and a method of manufacturing a semiconductor device by using the impurity diffusion method.

According to a first aspect of the present invention, there is provided an impurity diffusion method for diffusing impurities into a thin film, the method including: (1) transferring an object, on which the thin film is formed, into a processing chamber; (2) raising a temperature of the object to a vapor diffusion temperature in the processing chamber; and (3) supplying an impurity-containing gas that contains the impurities into the processing chamber together with an inert gas and diffusing the impurities into the thin film formed on the object of which the temperature is raised to the vapor diffusion temperature, wherein in the (3), an impurity diffusion acceleration gas for accelerating the diffusion of the impurities into the thin film, is supplied into the processing chamber, together with the impurity-containing gas and the inert gas.

According to a second aspect of the present invention, there is provided an impurity diffusion method performed on a thin film, the method including: (1) transferring an object, on which the thin film is formed, into a processing chamber; (2) raising a temperature of the object on which the thin film is formed, to a vapor diffusion temperature in the processing chamber; and (3) supplying an impurity-containing gas that contains impurities into the processing chamber, together with an inert gas and diffusing the impurities in the thin film formed on the object of which the temperature is raised to the vapor diffusion temperature, wherein in the (2), a reducing gas having a reducing function is supplied into the processing chamber, together with the inert gas so that a native oxide film existing on a surface of the thin film that is formed on the object is reduced while raising the temperature of the object.

According to a third aspect of the present invention, there is provided a substrate processing apparatus that may be used in a diffusion process in which impurities are diffused into a thin film, the substrate processing apparatus including: a processing chamber into which an object is transferred; a heating mechanism which heats the object in the processing chamber to raise a temperature of the object; a gas supply mechanism which supplies an impurity-containing gas that contains an impurity, an inert gas, and an impurity diffusion acceleration gas or a reducing gas into the processing chamber; and a control unit which controls the heating mechanism and the gas supply mechanism, wherein the control unit controls the heating mechanism and the gas supply mechanism so as to perform the impurity diffusion method according to any one of the first and second aspects.

According to a fourth aspect of the present invention, there is provided a method of manufacturing a semiconductor device, the method including: (1) forming a conductive film on a semiconductor substrate; (2) etching the conductive film; and (3) performing vapor diffusion of impurities on an etched surface of the conductive film, wherein the (3) is performed by using the impurity diffusion method according to any one of the first and second aspects.

According to a fifth aspect of the present invention, there is provided a method of manufacturing a semiconductor device, the method including: (1) sequentially forming a tunnel insulating film and a first conductive film forming a floating gate electrode on a semiconductor substrate; (2) forming a shallow trench in the semiconductor substrate and isolating the first conductive film and the tunnel insulating film along a first direction by etching the first conductive film, the tunnel insulating film, and the semiconductor substrate; (3) performing vapor diffusion of impurities on an etched surface of the first conductive film formed in the first direction; (4) burying the shallow trench with a device isolation insulating material; (5) sequentially forming an insulating film forming an inter-gate insulating film, and a second conductive film forming a control gate electrode on the first conductive film and the device isolation insulating material; (6) isolating the second conductive film, the insulating film, the first conductive film, and the tunnel insulating film in a second direction that crosses the first direction by etching the second conductive film, the insulating film, the first conductive film, and the tunnel insulating film; and (7) performing vapor diffusion of the impurities on an etched surface of the first conductive film formed along the second direction, wherein at least one of the (3) and the (7) is performed by using the impurity diffusion method according to any one of the first and second aspects.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
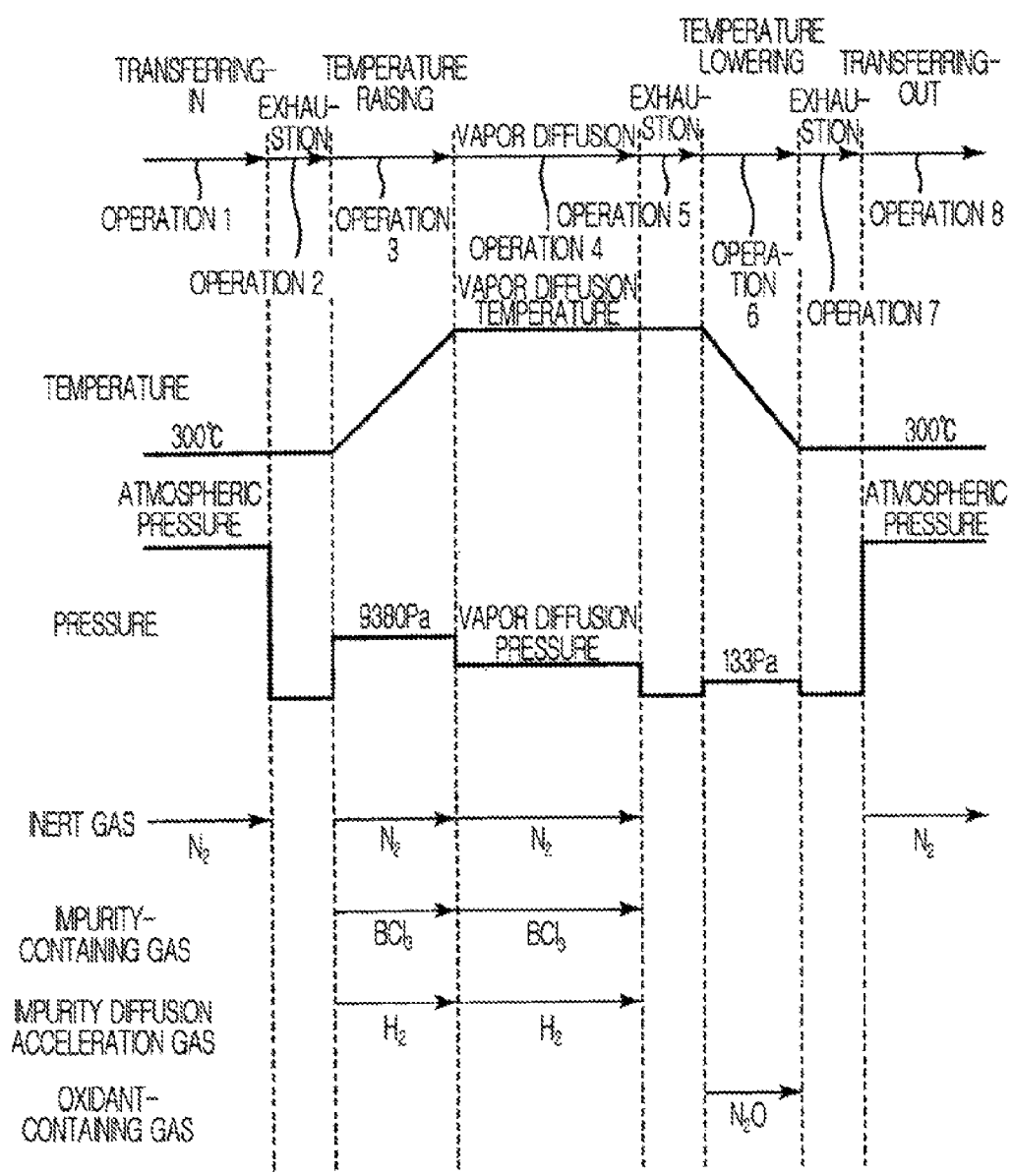
FIG. 1 is a timing diagram showing an impurity diffusion method according to a first embodiment of the present invention.

An embodiment of the present invention achieved on the basis of the findings given above will now be described with reference to the accompanying drawing. In the following description, the constituent elements having substantially the same function and arrangement are denoted by the same reference numerals, and a repetitive description will be made only when necessary.

Hereinafter, embodiments of the present invention will be described below with reference to accompanying drawings. Also, like reference numerals denote like elements throughout.

(First Embodiment)

Figure 2A:
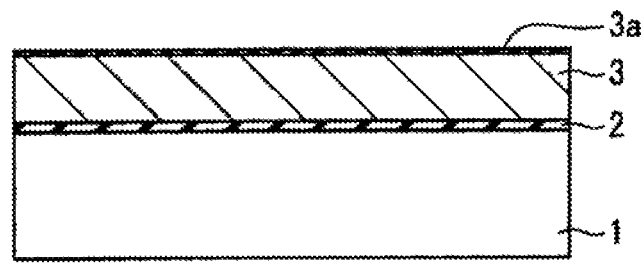
FIG. 2A is a cross-sectional view schematically showing an object.
Figure 2B:
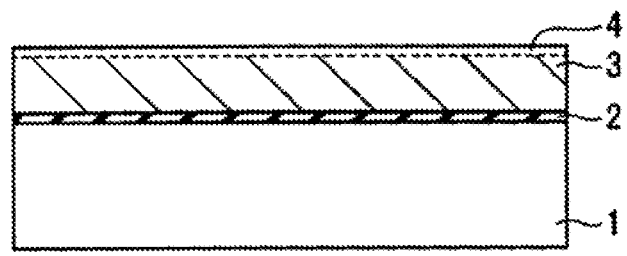
FIG. 2B is a cross-sectional view schematically showing an object.
Figure 2C:
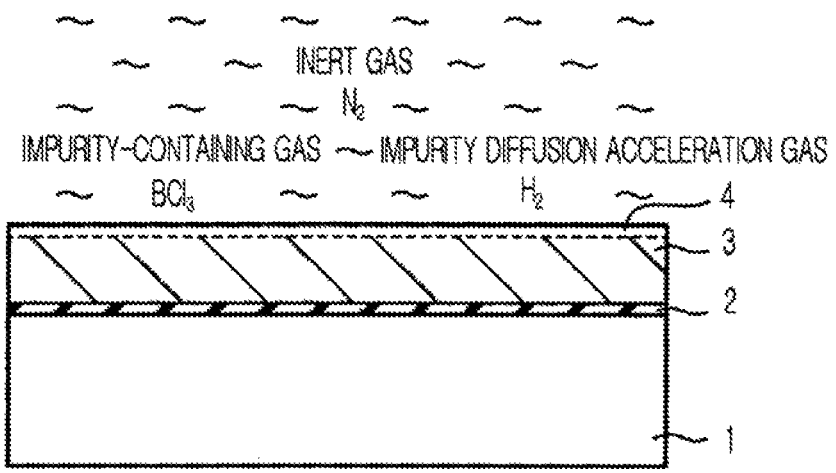
FIG. 2C is a cross-sectional view schematically showing an object.

FIG. 1 is a timing diagram showing an impurity diffusion method according to a first embodiment of the present invention, and FIGS. 2A through 2C are cross-sectional views schematically showing an object.

First, as shown in FIG. 2A, an object in which impurities are diffused is prepared. In the present embodiment, a semiconductor substrate, for example, a silicon substrate 1, is prepared. A silicon oxide film 2, for example, is formed on the silicon substrate 1, and a polysilicon film 3 doped with impurities, for example, boron, is formed on the silicon oxide film 2. A surface oxide film 3a is formed on the polysilicon film 3. The surface oxide film 3a may be a film intentionally formed by, for example, performing thermal oxidation on a surface of the polysilicon film 3, or may be a native oxide film naturally grown on the surface of the polysilicon film 3 when, for example, the polysilicon film 3 is exposed to the atmosphere. In the present embodiment, a boron concentration in the polysilicon film 3 is $1 \times 10^{17}$ atoms/cm$^3$. Later, impurities, for example, boron, is vapor diffused into the polysilicon film 3.

Next, as shown in FIG. 2B, a pre-cleaning process of the silicon substrate 1 is performed by using diluted fluoric acid having a concentration of 1% for 3 minutes. Subsequently, the silicon substrate 1 is cleaned by using pure water for 20 minutes, and after that, is dried for 10 minutes. Due to the pre-cleaning process using the diluted fluoric acid having a concentration of 1%, the surface oxide film 3a is peeled. Here, if oxygen atoms are coupled to the surface of the polysilicon film 3, it becomes difficult for boron to be adsorbed on the surface of the polysilicon film 3. Thus, before performing the vapor diffusion of the boron, the surface oxide film 3a is peeled from the surface of the polysilicon film 3. Accordingly, it is easy to adsorb boron onto the surface of the polysilicon film 3, and accordingly, it is easy to diffuse boron in the polysilicon film 3. Also, as shown in FIG. 2B, an impurity loss layer 4 which loses the impurity and has a depth of about 15 nm from the surface of the polysilicon film 3, is formed in the polysilicon film 3 and the impurity is boron in the present embodiment. The impurity loss layer 4 may correspond to an impurity loss layer generated in an etching process or a surface oxidation process in processes of manufacturing a semiconductor device.

Next, as shown in operation 1 of FIG. 1, the silicon substrate 1 that has performed the pre-cleaning, the cleaning and the drying process, is transferred into a processing chamber of a substrate processing apparatus which diffuses impurities. The process of transferring into the processing chamber is performed within 10 minutes after performing the pre-cleaning, the cleaning, and the drying processes. When transferring the silicon substrate 1 into the processing chamber, the processing chamber is maintained at atmospheric pressure, and an inert gas is supplied into the processing chamber. An example of the inert gas is a nitrogen (N$_2$) gas.

Next, as shown in operation 2 of FIG. 1, supplying of the inert gas is stopped, and the processing chamber is exhausted. Here, the pressure in the processing chamber becomes, for example, less than 133 Pa (=1 Torr).

Next, as shown in operation 3 of FIG. 1, the inert gas (N$_2$ gas) is supplied into the processing chamber to increase the pressure in the processing chamber, for example, to 9380 Pa (=70 Torr). The inert gas may function as, for example, a carrier gas and/or is a diluting gas. Also, the silicon substrate 1 in the processing chamber is heated to raise a temperature of the silicon substrate 1 to a vapor diffusion temperature. The vapor diffusion temperature may be, for example, 600° C. In the temperature raising process, an impurity-containing gas, for example, a boron-containing gas, and an impurity diffusion acceleration gas for accelerating diffusion of the impurity are additionally supplied into the processing chamber according to the present embodiment. The boron-containing gas may be, for example, a boron trichloride (BCl$_3$) gas. The impurity diffusion acceleration gas may be, for example, a hydrogen (H$_2$) gas. Also, the boron trichloride gas of a concentration of 1% is used as the boron-containing gas, in the present embodiment. The boron trichloride gas having a concentration of 1% can be obtained by, for example, mixing a nitrogen gas of 99% and a boron trichloride gas of 1%, in mole fraction.

In the temperature raising process, examples of supply amounts of the inert gas, the impurity-containing gas, and the impurity diffusion acceleration gas are as follows.

Inert gas (N$_2$): 500 sccm
Impurity-containing gas (BCl$_3$(1%)): 100 sccm
Impurity diffusion acceleration gas (H$_2$): 100 sccm Next, as shown in operation 4 of FIG. 1 and FIG. 2C, when the temperature of the silicon substrate 1 reaches the vapor diffusion temperature, the pressure in the processing chamber is adjusted to a vapor diffusion pressure. The vapor diffusion pressure may be, for example, 5998.3 Pa (=45.1 Torr). Also, the inert gas (N$_2$), the impurity-containing gas (BCl$_3$), and the impurity diffusion acceleration gas (H$_2$) are continuously supplied to the processing chamber. Accordingly, the vapor diffusion process is performed for, for example, 10 minutes.

In the vapor diffusion process, examples of supply amounts of the inert gas, the impurity-containing gas, and the impurity diffusion acceleration gas are as follows.

Inert gas (N$_2$): 500 sccm
Impurity-containing gas (BCl$_3$(1%)): 100 sccm
Impurity diffusion acceleration gas (H$_2$): 100 sccm Next, as shown in operation 5 of FIG. 1, after finishing the vapor diffusion process, the supplying of the inert gas, the impurity-containing gas, and the impurity diffusion acceleration gas is stopped, and the processing chamber is exhausted. Here, the pressure in the processing chamber is maintained at a low pressure, for example, less than 133 Pa (=1 Torr).

Next, as shown in operation 6 of FIG. 1, after the exhaustion process, heating of the silicon substrate 1 is stopped, and the temperature of the silicon substrate 1 is lowered so as to be low enough to be transferred from the processing chamber. The temperature at which the silicon substrate 1 can be transferred from the processing chamber is, for example, 300° C. Also, the temperature of the silicon substrate 1 when transferred from the processing chamber is 300° C. In addition, at the temperature of 300° C., useless native oxidation due to oxygen (O$_2$) gas in the atmosphere hardly occurs on the surface of the polysilicon film 3.

Also, in the present embodiment, an oxidant-containing gas is supplied into the processing chamber during the temperature lowering process. The pressure in the processing chamber may be, for example, 133 Pa (=1 Torr). The oxidant-containing gas may be, for example, a nitrous oxide (N$_2$O) gas. For example, when lowering the temperature to 300° C., the oxidant-containing gas is supplied into the processing chamber, and thus, a thin silicon oxide film is formed on the surface of the polysilicon film 3. The thin silicon oxide film functions as a protective oxide film that restrains boron doped on the polysilicon film 3 from being diffused to outside.

When the protective oxide film is formed in the temperature lowering process, an example of a supply amount of the oxidant-containing gas is as follows.

Oxidant-containing gas ($N_2O$): 1000 sccm

Also, the forming of the protective oxide film may be omitted, if necessary.

Next, as shown in operation 7 of FIG. 1, after finishing the temperature lowering process, the supplying of the oxidant-containing gas is stopped, and the processing chamber is exhausted. Here, the pressure in the processing chamber is maintained at a low pressure, for example, less than 133 Pa (=1 Torr).

Next, as shown in operation 8 of FIG. 1, after finishing the temperature lowering process, the inert gas is supplied into the processing chamber to set the pressure in the processing chamber at the atmospheric pressure, and the silicon substrate 1, on which the polysilicon film 3 in which the vapor diffusion process is finished is formed, is transferred from the processing chamber.

As such, the impurity diffusion process according to the impurity diffusion method of the first embodiment is finished.

Figure 3:
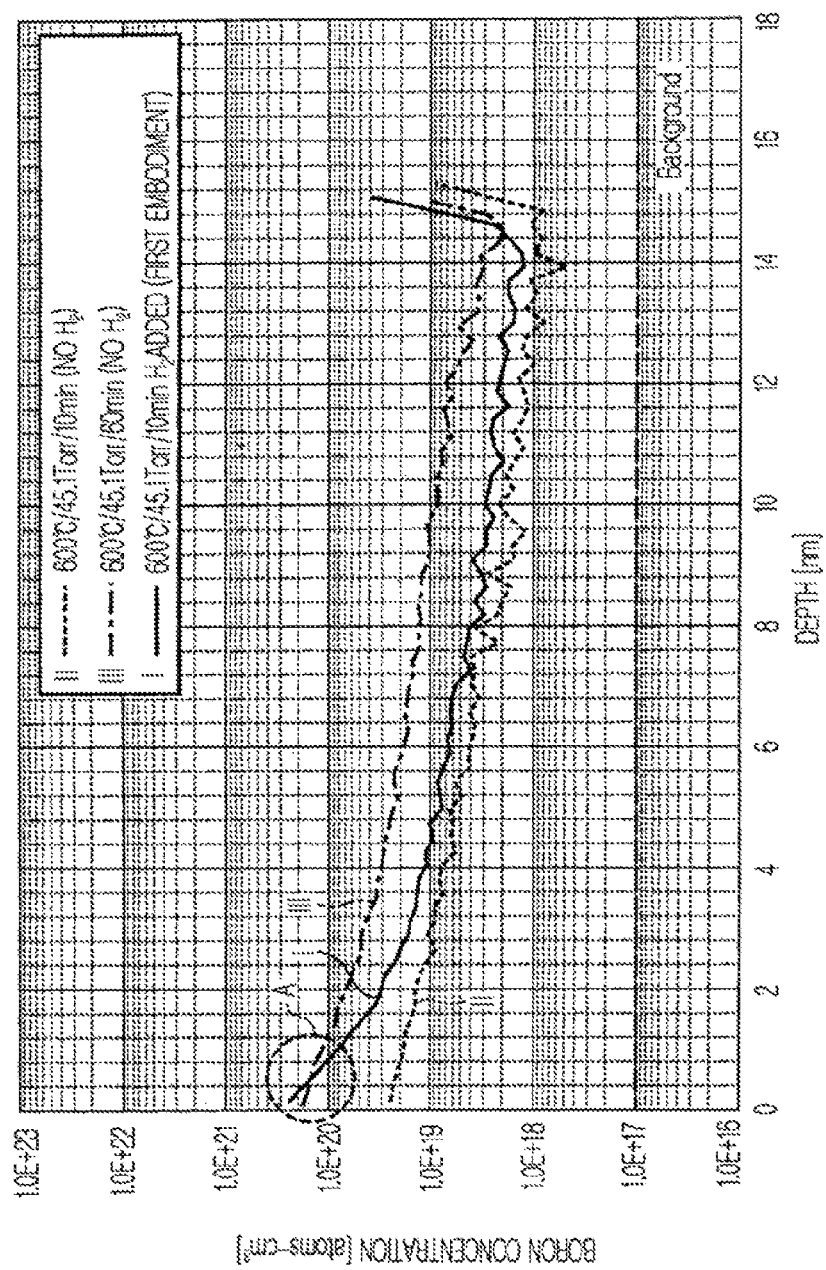
FIG. 3 is a diagram showing a relationship between a depth of a polysilicon layer and a boron concentration.

FIG. 3 is a diagram showing a relationship between a depth of the polysilicon film 3 and the boron concentration. FIG. 3 is obtained by performing second ion mass spectroscopy (SIMS) on the polysilicon film 3 to calculate the concentration of boron contained in the polysilicon film 3 in a depth direction.

In FIG. 3, a solid line I denotes the first embodiment, a dashed line II denotes a case where conditions such as the temperature, the pressure, and the diffusion time are the same as those of the first embodiment, while the impurity diffusion acceleration gas, for example, the hydrogen gas, is not added, and a dash-dot line III denotes a case where the hydrogen gas is not added like in the case of the dashed line II, while the diffusion time increases from 10 minutes to 60 minutes.

As denoted by the solid line I of FIG. 3, according to the first embodiment, more boron is diffused in the polysilicon film 3 compared with the case where the hydrogen gas is not added (dashed line II).

Also, when the diffusion time is increased, more boron can be diffused in the polysilicon film 3 even if the hydrogen gas is not added, compared with the dashed line II (dash-dot line III). However, a long diffusion time causes degradation in throughput in manufacturing of the semiconductor device. Thus, it is difficult to increase the diffusion time in an actual manufacturing process.

According to the first embodiment, in which the impurity diffusion acceleration gas, for example, the hydrogen gas, is added, more impurities, for example, boron, may be diffused in the polysilicon film 3 when comparing with the case where the hydrogen gas is not added, even if the diffusion time is short. Thus, the degradation of throughput may be prevented, and the impurity diffusion method may be effectively applied to the manufacturing process of the semiconductor device.

Moreover, according to the first embodiment, as shown in a dashed circle A of FIG. 3, more boron is contained around the surface of the polysilicon film 3 even compared with when a long diffusion time is taken. This denotes that a drive-in of the impurities to the polysilicon film 3 is accelerated when the impurity diffusion acceleration gas is added during the vapor diffusion process. The presence of a lot of impurities around the surface is advantageous in compensating for the impurities lost during, for example, an etching process.

As described above, according to the impurity diffusion method of the first embodiment, the vapor diffusion of the impurities into a thin film, for example, the polysilicon film 3, can be performed at higher concentration within a shorter period of time.

(Second Embodiment)

Figure 4:
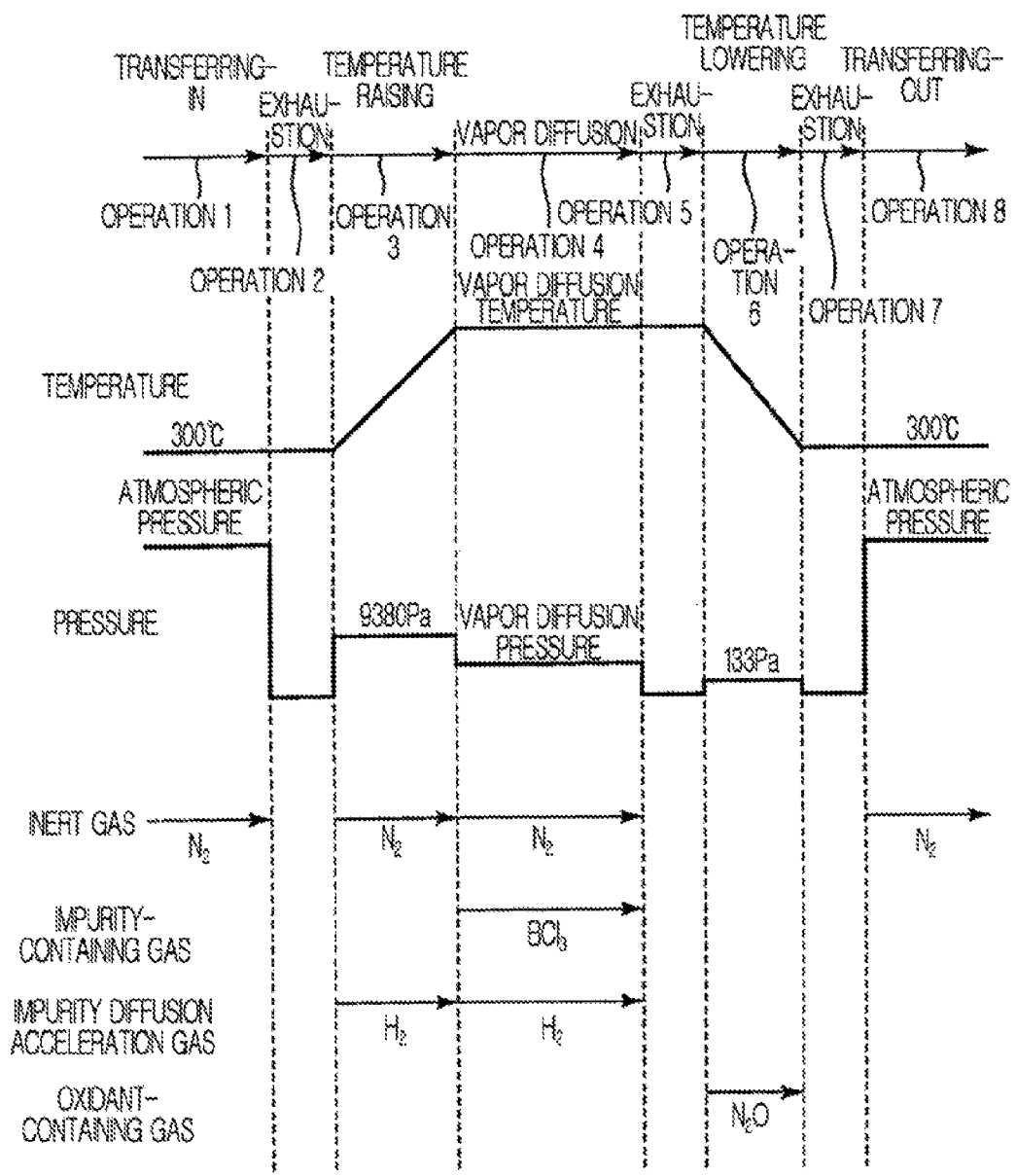
FIG. 4 is a timing diagram showing an impurity diffusion method according to a second embodiment of the present invention.

FIG. 4 is a timing diagram showing an impurity diffusion method according to a second embodiment of the present invention.

As shown in FIG. 4, the impurity diffusion method according to the second embodiment is different from that of the first embodiment shown in FIG. 1 and the like in that the impurity-containing gas, for example, the boron trichloride gas, is not supplied into the processing chamber in the temperature raising process of operation 3.

In the temperature raising process (operation 3), examples of supply amounts of an inert gas and an impurity-containing gas are as follows.

Inert gas ($N_2$): 500 sccm
Impurity diffusion acceleration gas ($H_2$): 100 sccm Also, examples of supply amounts of the inert gas, the impurity-containing gas, and the impurity diffusion acceleration gas in the vapor diffusion process (operation 4) are as follows.

Inert gas ($N_2$): 500 sccm
Impurity-containing gas ($BCl_3$(1%)): 100 sccm
Impurity diffusion acceleration gas ($H_2$): 100 sccm As shown in the second embodiment, the impurity-containing gas may be supplied only in the vapor diffusion process of operation 4. In this case, since the impurity diffusion acceleration gas, for example, the hydrogen gas, is supplied into the processing chamber, the impurity, for example, boron, may be diffused at a higher concentration per unit time compared with a case where the impurity diffusion acceleration gas is not supplied.

(Third Embodiment)

Figure 5:
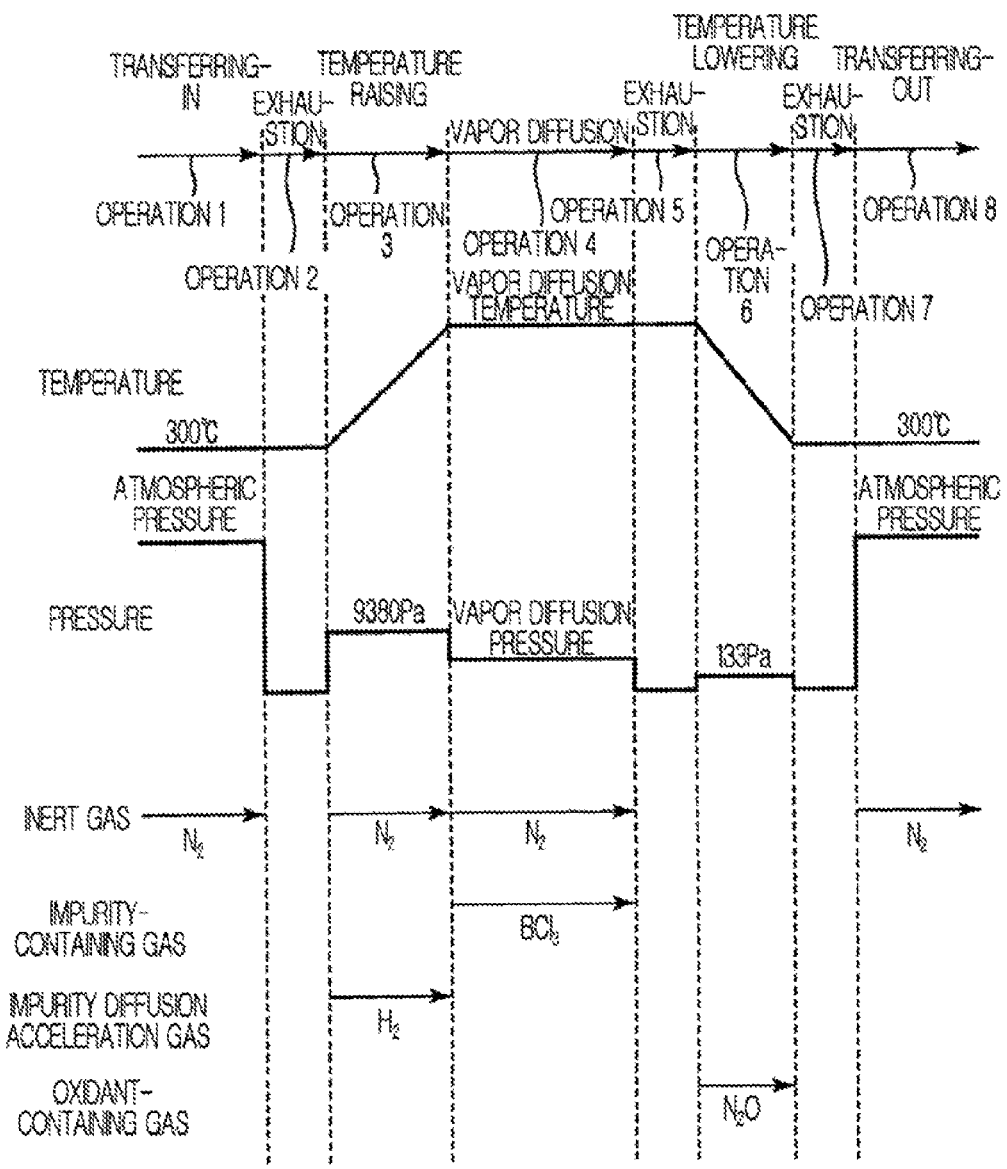
FIG. 5 is a timing diagram showing an impurity diffusion method according to a third embodiment of the present invention.

FIG. 5 is a timing diagram showing an impurity diffusion method according to a third embodiment of the present invention.

As shown in FIG. 5, the impurity diffusion method according to the third embodiment is different from that of the first embodiment shown in FIG. 1 and the like in that the impurity-containing gas, for example, the boron trichloride gas, is not supplied into the processing chamber in the temperature raising process of FIG. 3 and the impurity diffusion acceleration gas, for example, the hydrogen gas, is not supplied in the vapor diffusion process of operation 4.

Examples of supply amounts of the inert gas and the impurity diffusion acceleration gas in the temperature raising process (operation 3) are as follows.

Inert gas ($N_2$): 500 sccm
Impurity diffusion acceleration gas ($H_2$): 100 sccm Also, examples of supply amounts of the inert gas and the impurity-containing gas in the vapor diffusion process (operation 4) are as follows.

Inert gas ($N_2$): 500 sccm
Impurity-containing gas ($BCl_3$(1%)): 100 sccm

Like the third embodiment, the impurity-containing gas may be supplied only in the vapor diffusion process of operation 4, and the impurity diffusion acceleration gas may be supplied only in the temperature raising process of operation 3. In particular, in a case where the impurity diffusion acceleration gas is supplied only in the temperature raising process of operation 3, the impurity diffusion acceleration gas may be a reducing gas. For example, the hydrogen gas is a reducing gas. In the temperature raising process, by supplying the hydrogen gas that is the reducing gas to the processing chamber, the native oxide film formed on the polysilicon film 3 is reduced and removed. Thus, in the vapor diffusion process, the impurities, for example, boron, may be diffused in a state where the native oxide film is removed from the surface of the polysilicon film 3. Therefore, compared with a case where the vapor diffusion process is performed in a state where the native oxide film exists on the surface of the polysilicon film 3, the impurities, for example, boron, may be diffused in the polysilicon film 3 at a higher concentration per unit time.

(Comparison Result)

Figure 6:
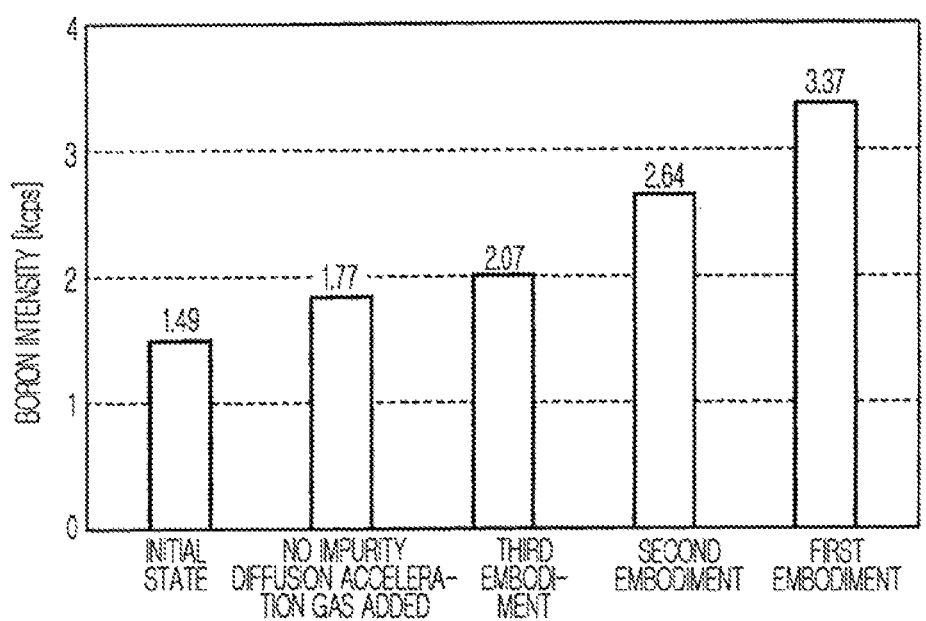
FIG. 6 is a diagram showing results of determining boron intensity in each of samples.

FIG. 6 is a diagram showing results of measuring boron intensity in each of samples. In FIG. 6, the polysilicon film 3 is analyzed by an X-ray fluorescence (XRF) analysis method to calculate intensity of boron contained in the polysilicon film 3. Samples are as follows:

(1) No vapor diffusion . . . initial state;
(2) Vapor diffusion . . . no impurity diffusion acceleration gas;
(3) the first embodiment;
(4) the second embodiment; and
(5) the third embodiment.

Also, conditions of the vapor diffusion process are as follows:
vapor diffusion pressure: 598.5 Pa (4.5 Torr);
vapor diffusion temperature: 800° C.; and
vapor diffusion time: 10 min.

As shown in FIG. 6, the boron intensity in a case of no vapor diffusion that is, the polysilicon film 3 at an initial state, is 1.49 kcps.

First, when the vapor diffusion of the impurity-containing gas only, for example, the boron trichloride gas, is performed without adding the impurity diffusion acceleration gas, the boron intensity increases to 1.77 kcps.

Also, in this example, the inert gas is only supplied without supplying the boron trichloride gas, in operation 3. The supply amount is as follows.

Inert gas ($N_2$): 500 sccm

In addition, supply amounts of the inert gas and the boron trichloride gas in operation 4 are as follows.

Inert gas ($N_2$): 500 sccm
Impurity-containing gas ($BCl_3$(1%)): 100 sccm

As shown in the third embodiment of FIG. 5, when the impurity diffusion acceleration gas (reducing gas), for example, the hydrogen gas, is supplied into the processing chamber in the temperature raising process (operation 3), the boron intensity increases to 2.07 kcps.

As shown in the second embodiment of FIG. 4, when the impurity diffusion acceleration gas, for example, the hydrogen gas, is supplied into the processing chamber in both of the temperature raising process (operation 3) and the vapor diffusion process (operation 4), the boron intensity increases to 2.64 kcps.

As shown in the first embodiment of FIG. 1, when the impurity-containing gas, for example, the boron trichloride gas, and the impurity diffusion acceleration gas, for example, the hydrogen gas, are supplied into the processing chamber in both of the temperature raising process (operation 3) and the vapor diffusion process (operation 4), the boron intensity increases to 3.37 kcps.

As described above, any of the first through third embodiments shows the improvement of the boron intensity in the polysilicon film 3, compared with the case where the impurity diffusion acceleration gas is not added.

(Temperature and Pressure Dependency of the Boron Intensity)

Figure 7:
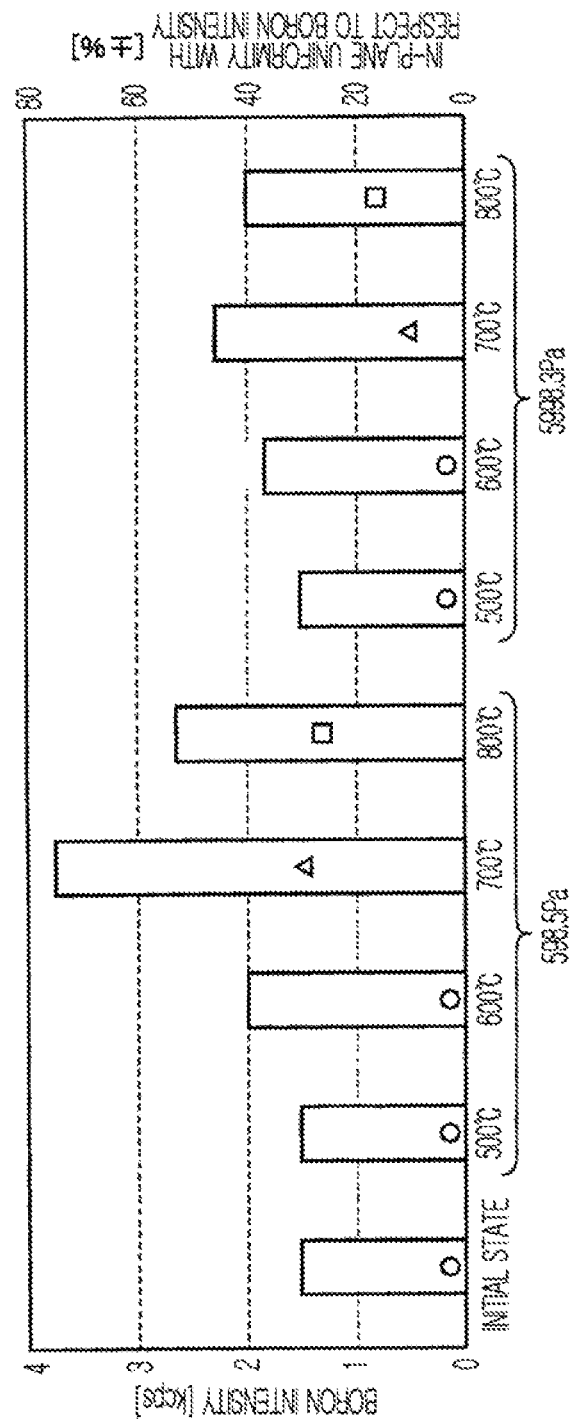
FIG. 7 is a diagram showing boron intensity and an in-plane uniformity with respect to the boron intensity.

FIG. 7 is a diagram showing the boron intensity and an in-plane uniformity with respect to the boron intensity.

Referring to FIG. 7, two kinds of vapor diffusion pressure, that is, 598.5 Pa (=4.5 Torr) and 5998.3 Pa (=45.1 Torr), are set, and four kinds of vapor diffusion temperature, that is, 500° C., 600° C., 700° C., and 800° C., are set for each of the two vapor diffusion pressures, and then, the boron intensities thereof are compared with each other. Also, the vapor diffusion is performed as described in the second embodiment.

First, regarding a pressure dependency, the boron intensity at the vapor diffusion pressure of 598.5 Pa is greater than that of the vapor diffusion pressure of 5998.3 Pa. Thus, the vapor diffusion is desirably performed at a pressure of less than 5998.3 Pa.

Next, regarding a temperature dependency, when the vapor diffusion temperature is 500° C., the boron intensity is 1.52 kcps (vapor diffusion pressure 598.5 Pa (=4.5 Torr)), and 1.51 kcps (vapor diffusion pressure 5998.3 Pa (=45.1 Torr)), which are not largely different from 1.49 kcps before the vapor diffusion (initial state). That is, if the vapor diffusion temperature is 500° C., the boron is rarely diffused. Thus, in order to effectively diffuse the boron, the vapor diffusion is desirably performed at a temperature of higher than 500° C.

Also, if the vapor diffusion temperature is 700° C. or 800° C., it is easy to diffuse the boron. However, the in-plane uniformity with respect to the boron intensity exceeds a range of ±10%. Thus, if the vapor diffusion temperature is 600° C., the in-plane uniformity with respect to the boron intensity is within a range of ±2.8% (vapor diffusion pressure 598.5 Pa) and ±3.1% (vapor diffusion pressure 5998.3 Pa), both of which is less than ±10%. Thus, if it is desired to restrain the in-plane uniformity with respect to the boron intensity within a range of, for example, ±10%, the vapor diffusion process is desirably performed at a temperature of less than 700° C.

(Time Dependency of the Boron Intensity)

However, if the vapor diffusion temperature is at 600° C., it is difficult to diffuse boron, compared with the vapor diffusion temperature of 700° C. Thus, the time dependency of the boron intensity is examined as follows.

Figure 8:
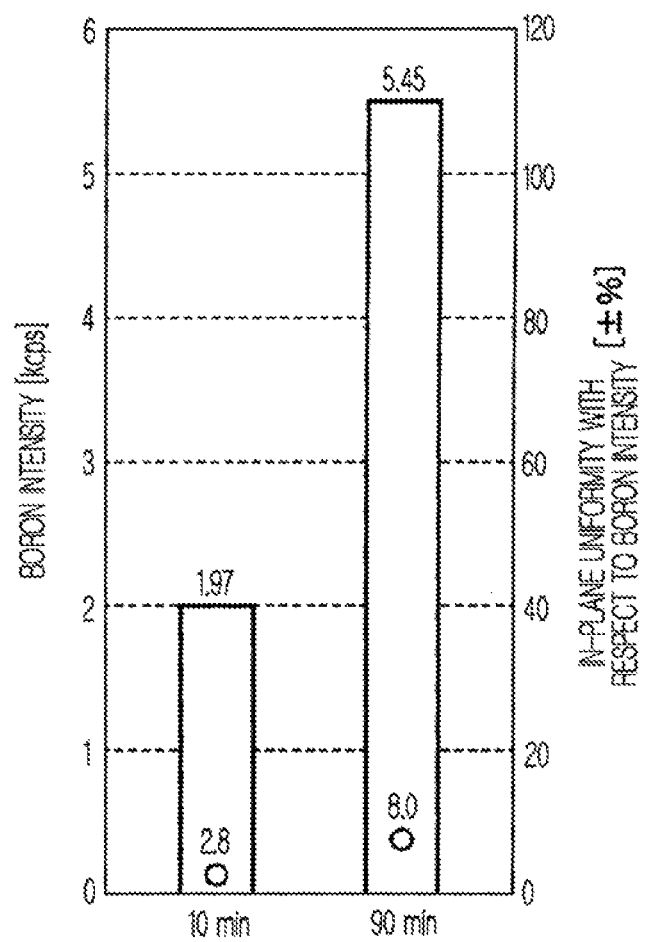
FIG. 8 is a diagram showing boron intensity and an in-plane uniformity with respect to the boron intensity.

FIG. 8 shows a boron intensity and an in-plane uniformity with respect to the boron intensity, when the vapor diffusion temperature is 600° C., the vapor diffusion pressure is 598.5 Pa (=4.5 Torr), and the vapor diffusion time is set as 10 minutes and 90 minutes. In the present example, the vapor diffusion is performed as described in the second embodiment.

Figure 9:
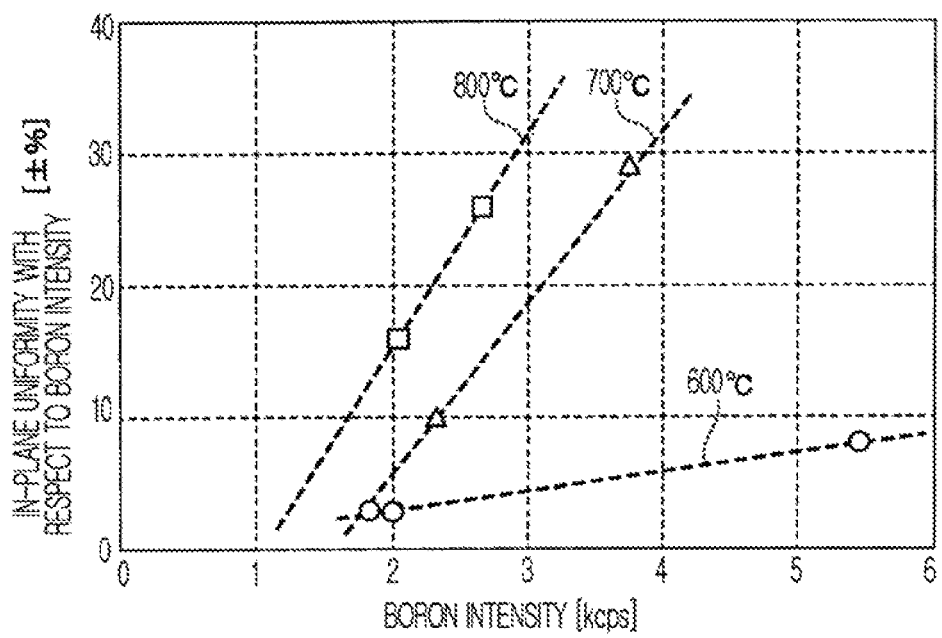
FIG. 9 is a diagram showing a relationship between the boron intensity and the in-plane uniformity with respect to the boron intensity.

As shown in FIG. 8, at the vapor diffusion temperature of 600° C., when the vapor diffusion time increases to 90 minutes, the boron intensity increases from 1.97 kcps to 5.45 kcps. Moreover, the in-plane uniformity with respect to the boron intensity increases from ±2.8% to ±8%, which is still less than ±10%. Thus, if the vapor diffusion temperature is set around 600° C., for example, within a range of 550° C. to 650° C., the boron intensity may be improved by adjusting the vapor diffusion time. Moreover, even if the boron intensity is improved, the in-plane uniformity with respect to the boron intensity is usually within the range of ±10%. FIG. 9 shows a relationship between the boron intensity and the in-plane uniformity with respect to the boron intensity.

(Pressure Dependency of the Boron Intensity)

As described with reference to FIG. 7, the boron intensity tends to increase at a lower vapor diffusion pressure. Thus, a lower limit of the vapor diffusion pressure of the boron intensity is determined as follows.

Figure 10:
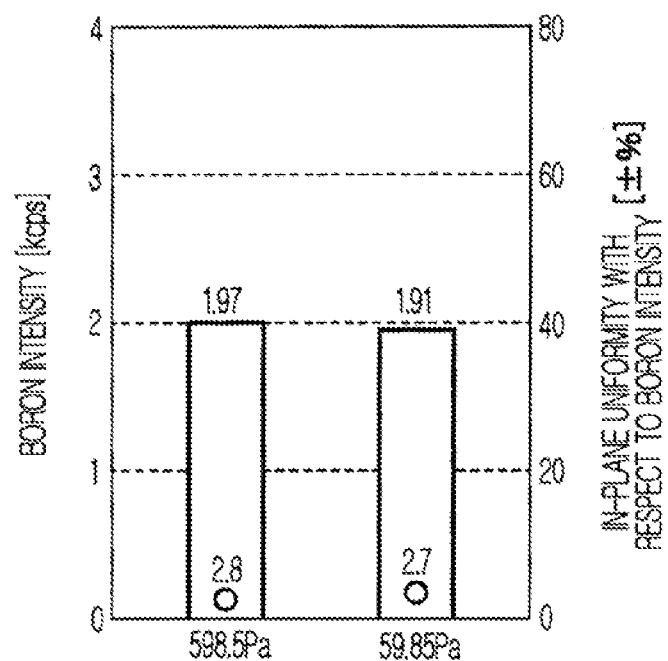
FIG. 10 is a diagram showing boron intensity and an in-plane uniformity with respect to the boron intensity.

FIG. 10 is a graph showing the boron intensity and the in-plane uniformity with respect to the boron intensity, when the vapor diffusion temperature is set at 600° C., the vapor diffusion time is set as 10 minutes, and the vapor diffusion pressure is set as 598.5 Pa and 59.85 Pa. In the present example, the vapor diffusion is performed as described in the second embodiment.

As shown in FIG. 10, at the vapor diffusion temperature of 600° C., when the vapor diffusion pressure is set as 59.85 Pa, the boron intensity decreases from 1.97 kcps to 1.91 kcps, that is, the boron intensity rarely changes. Also, the in-plane uniformity with respect to the boron intensity decreases from ±2.8% to ±2.7%, that is, it rarely changes. Thus, the vapor diffusion pressure may be set as 59.85 Pa or greater.

(Substrate Processing Apparatus)

Next, an example of a substrate processing apparatus capable of executing the impurity diffusion method according to the embodiment of the present invention will be described below.

Figure 11:
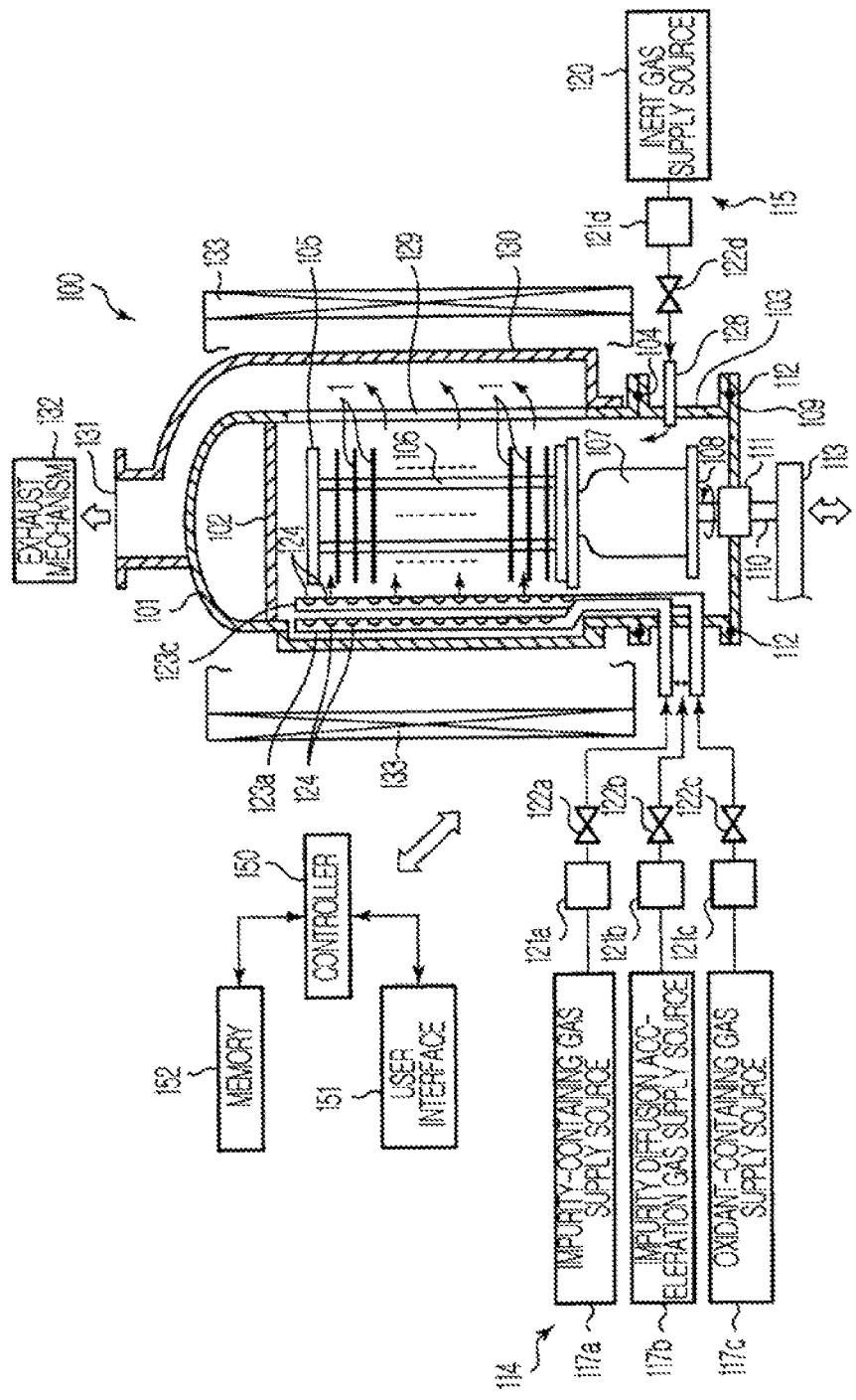
FIG. 11 is a cross-sectional view schematically showing a substrate processing apparatus capable of executing an impurity diffusion method according to an embodiment of the present invention.

FIG. 11 is a cross-sectional view schematically showing a substrate processing apparatus 100 capable of executing the impurity diffusion method according to an embodiment of the present invention.

As shown in FIG. 11, the substrate processing apparatus 100 includes a processing chamber 101 formed as a cylinder having an opened lower end and a ceiling. The processing chamber 101 may be entirely formed of, for example, quartz. A ceiling plate 102 formed of quartz is provided on the ceiling in the processing chamber 101. A manifold 103 formed of, for example, a stainless steel cylinder, is connected to the opened lower end of the processing chamber 101 via a sealing member 104 such as an O-ring.

The manifold 103 supports the lower end of the processing chamber 101. A wafer boat 105 that is formed of quartz and functions as a holding unit for holding a plurality of objects, for example, 50 to 100 semiconductor substrates, which are silicon substrates 1 in the present embodiment, in multiple stages, is configured to be inserted into the processing chamber 101 from a lower portion of the manifold 103. Accordingly, the silicon substrates 1 are accommodated in the processing chamber 101. The wafer boat 105 includes a plurality of pillars 106, and the plurality of silicon substrates 1 are supported by recesses formed in the plurality of pillars 106.

The wafer boat 105 is placed on a table 108 via a thermos tube 107 formed of quartz. The table 108 is supported on a rotary shaft 110 that penetrates through a cover portion 109 formed of, for example, stainless steel and opens/closes the opened lower end portion of the manifold 103. A magnetic fluid seal 111, for example, is provided on a penetration portion of the rotary shaft 110 so as to rotatably support the rotary shaft 110 and airtightly seal the rotary shaft 110. A sealing member 112 formed of, for example, an O-ring, is interposed between a peripheral portion of the cover portion 109 and the lower end portion of the manifold 103. Accordingly, a sealing property in the processing chamber 101 may be held. The rotary shaft 110 is attached to a leading end of an arm 113 supported by an elevation mechanism (not shown), for example, a boat elevator, so that the wafer boat 105, the cover portion 109, and the like are integrally elevated to be inserted into/withdrawn from the processing chamber 101.

The substrate processing apparatus 100 includes a processing gas supply mechanism 114 for supplying a gas used in a process in the processing chamber 101, and an inert gas supply mechanism 115 for supplying an inert gas in the processing chamber 101. The processing gas supply mechanism 114 of the present embodiment includes an impurity-containing gas supply source 117a, an impurity diffusion acceleration gas supply source 117b, and an oxidant-containing gas supply source 117c. The inert gas supply mechanism 115 includes an inert gas supply source 120.

An example of the impurity-containing gas is a boron trichloride gas, an example of the impurity diffusion acceleration gas is a hydrogen gas, an example of the oxidant-containing gas is a nitrous oxide gas, and an example of the inert gas is a nitrogen gas.

The impurity-containing gas supply source 117a is connected to a diffusion nozzle 123a via a flow controller 121a and an opening/closing valve 122a. Likewise, the impurity diffusion acceleration gas supply source 117b and the oxidant-containing gas supply source 117c are respectively connected to diffusion nozzles 123b and 123c via flow controllers 121b and 121c and opening/closing valves 122b and 122c.

Each of the diffusion nozzles 123a through 123c formed as quartz tubes penetrates through a side wall of the manifold 103 inward and then bends upward to extend vertically. A plurality of gas ejection holes 124 are formed in a vertical portion of each diffusion nozzle 123a, 123b, or 123c at predetermined intervals. Accordingly, each of the gases may be evenly discharged from the gas ejection holes 124 into the processing chamber 101 in a horizontal direction.

The inert gas supply source 120 is connected to a nozzle 128 via a flow controller 121d and an opening/closing valve 122d. The nozzle 128 is provided to penetrate through the side wall of the manifold 103 to eject the inert gas into the processing chamber 101 from a leading edge thereof in a horizontal direction.

An exhaust hole 129 for exhausting an inside of the processing chamber 101 is formed on a side opposite to the diffusion nozzles 123a through 123c in the processing chamber 101. The exhaust hole 129 is formed thin and long by shaving off the side wall of the processing chamber 101 in an up-and-down direction. An exhaust hole cover member 130 having a U-shaped cross-section is attached via welding to a portion corresponding to the exhaust hole 129 of the processing chamber 101 and covers the exhaust hole 129. The exhaust hole cover member 130 extends upward along the side wall of the processing chamber 101, and defines a gas outlet 131 at an upper portion of the processing chamber 101. An exhaustion mechanism 132, including a vacuum pump or the like, is connected to the gas outlet 131. The exhaust mechanism 132 exhausts the inside of the processing chamber 101 to exhaust the processing gas used in the processes and to adjust a pressure in the processing chamber 101 to a processing pressure according to a process.

A heating unit 133 formed as a cylinder is provided on an outer circumference of the processing chamber 101. The heating unit 133 activates the gas supplied into the processing chamber 101, and at the same time, heats the object accommodated in the processing chamber 101, which is the silicon substrates 1 in the present embodiment.

Each element in the substrate processing apparatus 100 is controlled by a controller 150 including, for example, a micro-processor (computer). A user interface 151, including a touch panel, through which an operator performs an input manipulation of a command for managing the substrate processing apparatus 100, a display for visibly representing operating states of the substrate processing apparatus 100, and the like may be connected to the controller 150.

A memory unit 152 is connected to the controller 150. The memory unit 152 stores a control program for executing various processes performed in the substrate processing apparatus 100 according to control of the controller 150, or a program for each of the components in the substrate processing apparatus 100 to perform the process according to the processing conditions, for example, a recipe. The recipe is stored in, for example, a recording medium in the memory unit 152. The recording medium may be a hard disk, a semiconductor memory, or a portable memory such as a CD-ROM, a DVD, or a flash memory. Also, the recipe may be transmitted from another device through, for example, a dedicated line. If necessary, a recipe is loaded from the memory unit 152 according to a command from the user interface 151 or the like, and the controller 150 performs a process according to the loaded recipe. Thus, the substrate processing apparatus 100 may perform a desired process under the control of the controller 150

In the present embodiment, processes, for example, according to the impurity diffusion methods of the first through third embodiments, are performed sequentially under the control of the controller 150.

The impurity diffusion method according to the first through third embodiments may be executed by the substrate processing apparatus 100 shown in FIG. 11.

Also, the substrate processing apparatus is not limited to a batch-type film forming apparatus shown in FIG. 11, and a single-wafer type film forming apparatus may be used. Also, the oxidant-containing gas supply source 117c may be formed if necessary.

(Method of Manufacturing a Semiconductor Device)

FIGS. 12A through 12J are perspective views respectively showing manufacturing processes of a semiconductor device. FIGS. 12A through 12J show a non-volatile semiconductor memory device as an example of the semiconductor device, and typical processes for manufacturing a floating gate electrode and a control gate electrode.

Figure 12A:
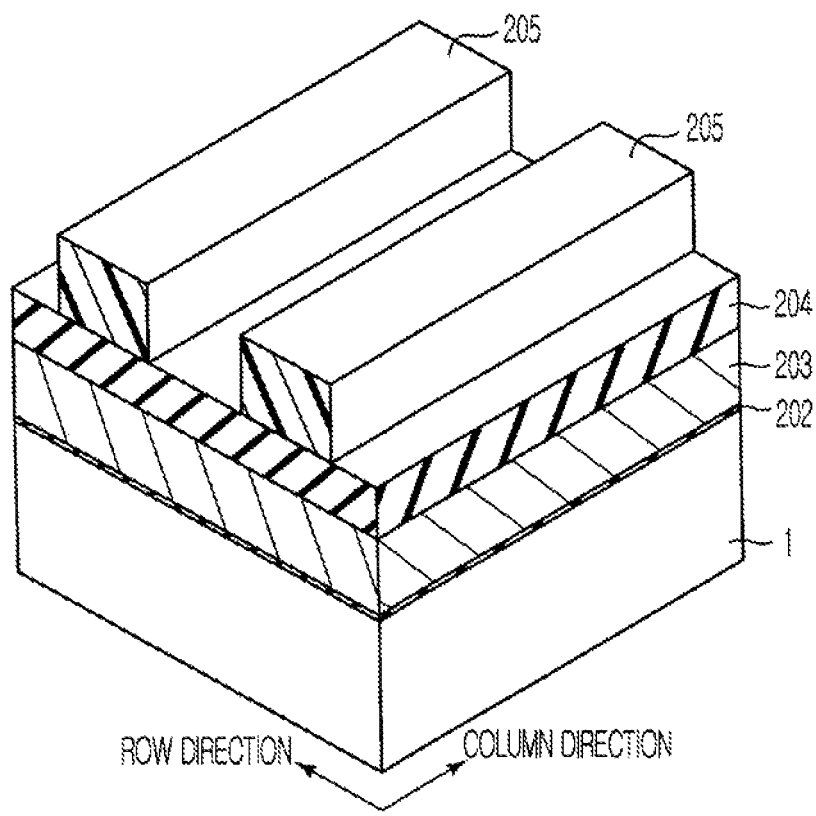
FIG. 12A is a perspective view of a semiconductor device during a manufacturing process.

First, as shown in FIG. 12A, a surface of a silicon substrate 1 is oxidized to form a tunnel oxide film 202. Subsequently, a conductive material becoming a floating gate electrode, for example, boron-containing silicon, is deposited on the tunnel oxide film 202 to form a first boron-containing polysilicon film 203. A material forming a hard mask, for example, silicon nitride, is deposited on the first boron-containing polysilicon film 203 to form a silicon nitride film 204. Photoresist is applied on the silicon nitride film 204 to form a photoresist film 205. Next, the photoresist film 205 is patterned to correspond to a pattern of a device area by using a photolithography method.

Figure 12B:
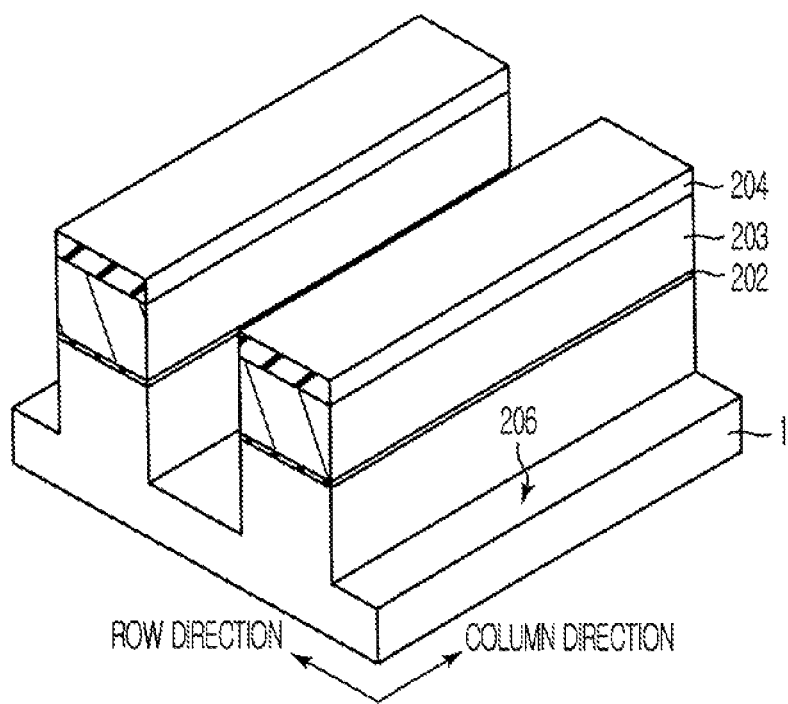
FIG. 12B is a perspective view of a semiconductor device during a manufacturing process.
Figure 12C:
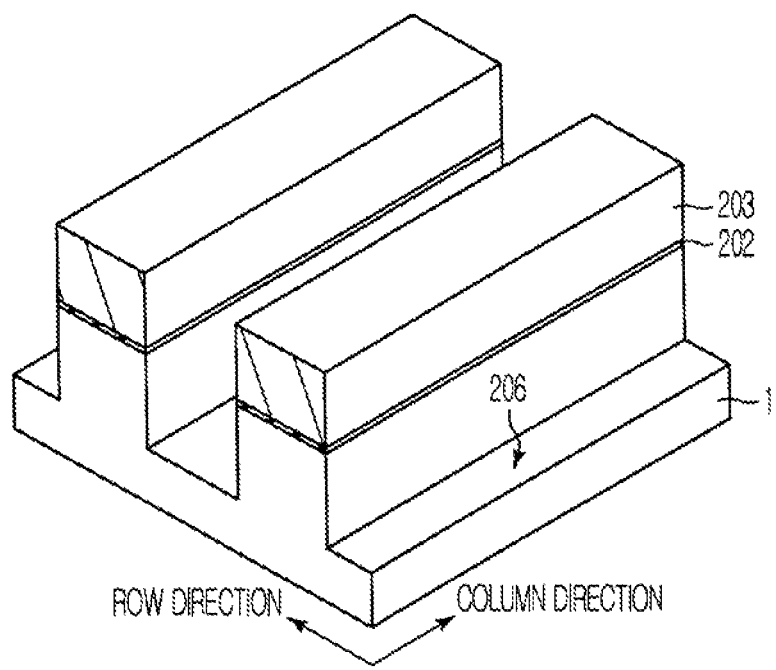
FIG. 12C is a perspective view of a semiconductor device during a manufacturing process.

Next, as shown in FIG. 12B, a shallow trench 206 is formed in the silicon substrate 1 by etching the silicon nitride film 204, the first boron-containing polysilicon film 203, the tunnel oxide film 202, and the silicon substrate 1 by using the photoresist film 205 as an etching mask, and then. Accordingly, the first boron-containing polysilicon film 203 and the tunnel oxide film 202 are isolated along a column direction. In the etching process, the silicon nitride film 204 functions as a etching mask after the photoresist film 205 is removed. When finishing the etching, the silicon nitride film 204 is removed as shown in FIG. 12C.

Figure 13A:
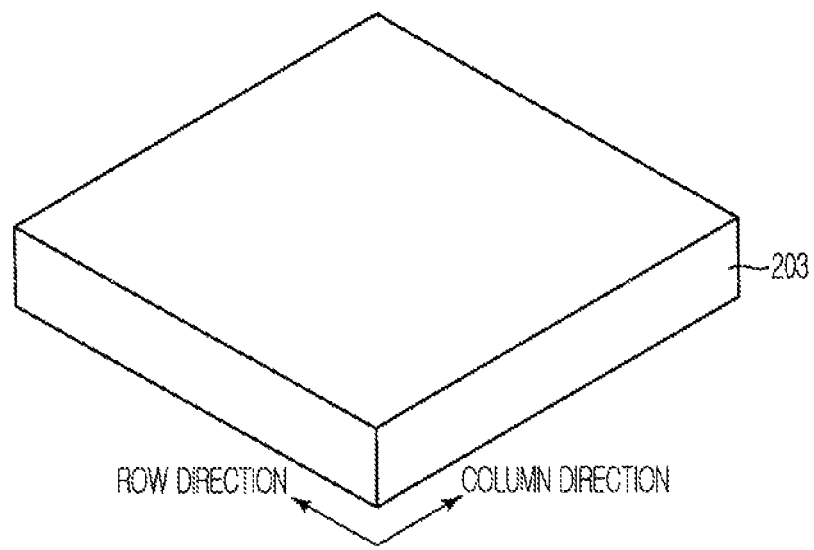
FIG. 13A is a perspective view showing an etched state of a first boron-containing polysilicon film.
Figure 13B:
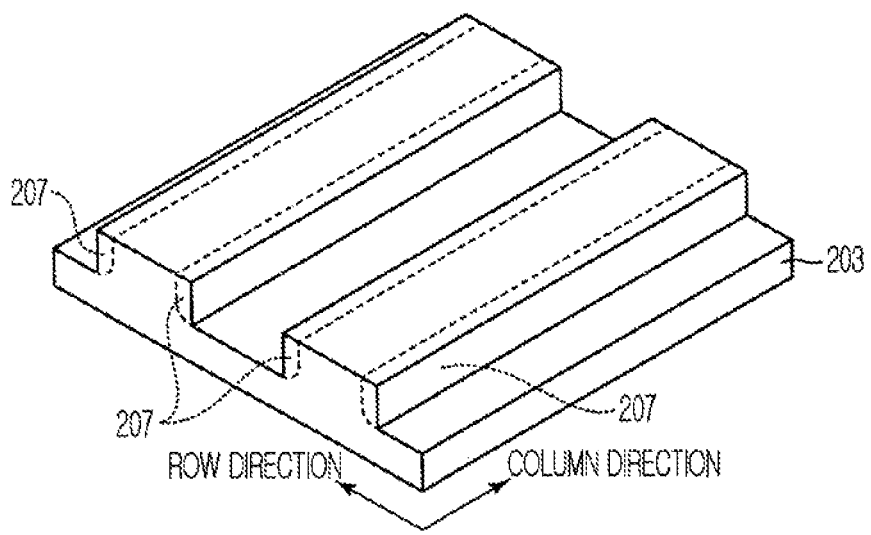
FIG. 13B is a perspective view showing an etched state of a first boron-containing polysilicon film.
Figure 13C:
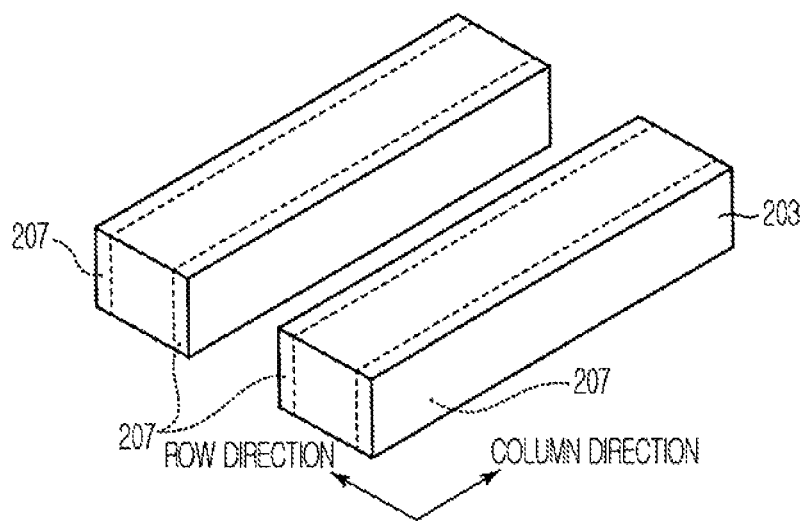
FIG. 13C is a perspective view showing an etched state of a first boron-containing polysilicon film.

FIGS. 13A through 13C are perspective views showing the first boron-containing polysilicon film 203 that is in the process of being etched.

Figure 12D:
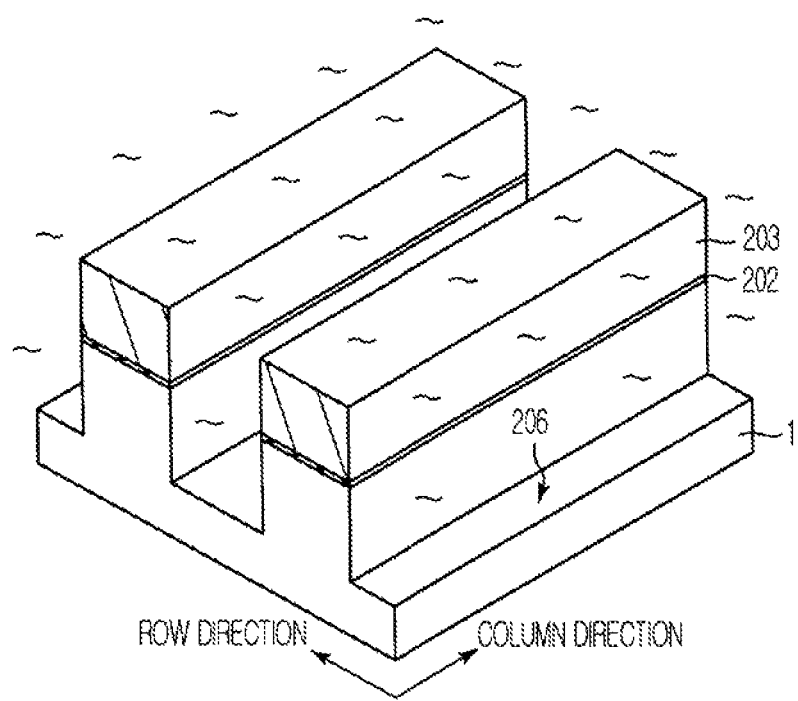
FIG. 12D is a perspective view of a semiconductor device during a manufacturing process.

As shown in FIGS. 13A through 13C, when performing the etching process for forming the shallow trench, the first boron-containing polysilicon film 203 is being etched along the column direction. During the etching process, the etching is performed while the etchant collides with or contacts an etched surface of the first boron-containing polysilicon film 203. Thus, as shown in FIGS. 13B and 13C, an impurity loss layer 207 in which an impurity, in the present embodiment, boron, is lost is formed on the etched surface of the first boron-containing polysilicon film 203. Thus, as shown in FIG. 12D, boron is vapor-diffused with respect to the etched surface, and is vapor-diffused with respect to the impurity loss layer 207. To perform the vapor diffusion of the boron, the impurity diffusion method according to the above embodiments of the present invention is applied. Accordingly, the lost boron may be compensated for within a short period of time at a high concentration.

Figure 12E:
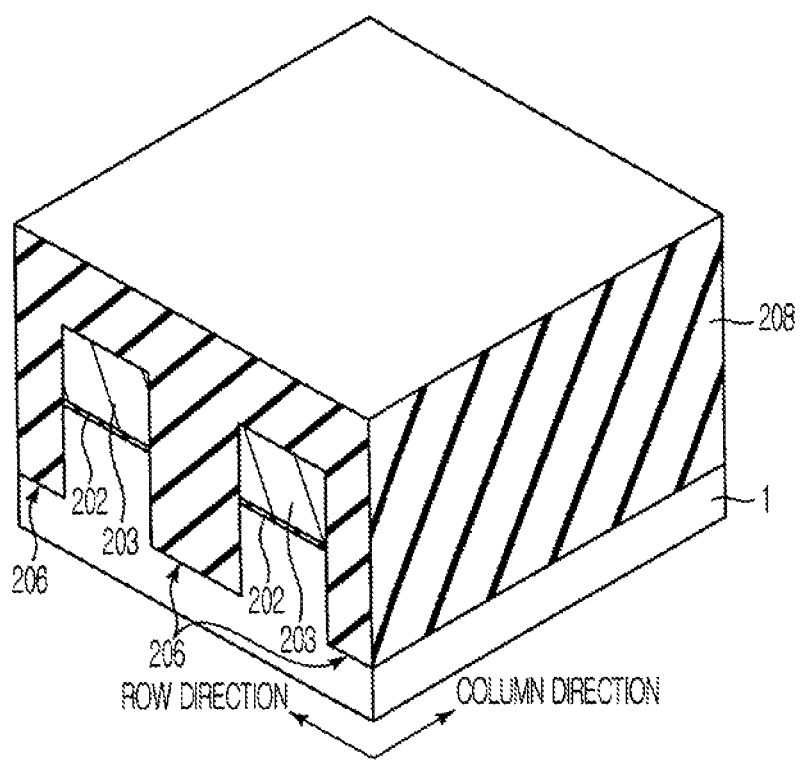
FIG. 12E is a perspective view of a semiconductor device during a manufacturing process.

Next, as shown in FIG. 12E, an insulating material, for example, silicon oxide, is deposited on the silicon substrate 1 and the first boron-containing polysilicon film 203 to form a silicon oxide film 208. Accordingly, the shallow trench 206 is buried with the silicon oxide film 208.

Figure 12F:
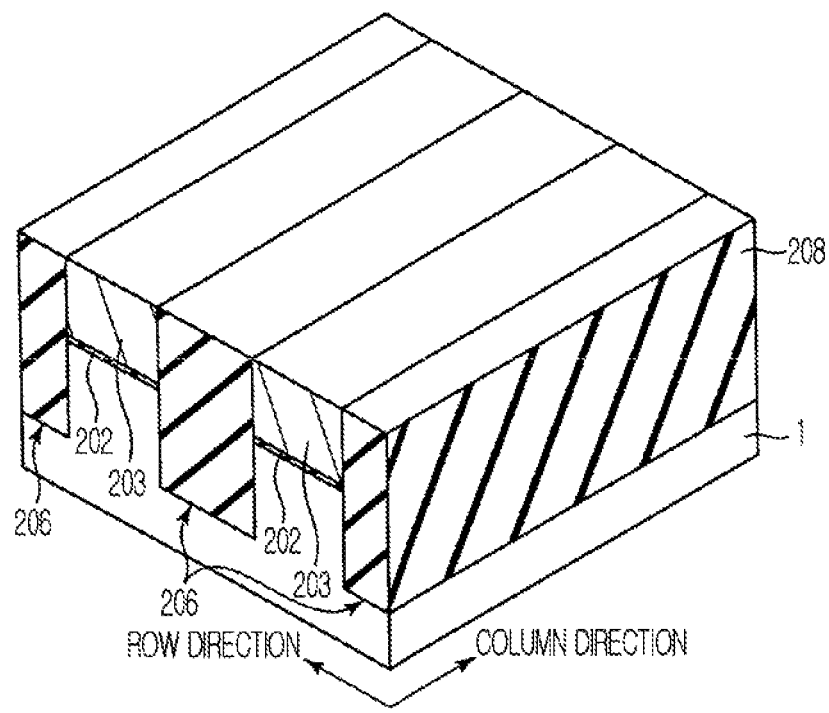
FIG. 12F is a perspective view of a semiconductor device during a manufacturing process.

Next, as shown in FIG. 12F, the silicon oxide film 208 is polished to retreat a surface of the silicon oxide film 208.

Figure 12G:
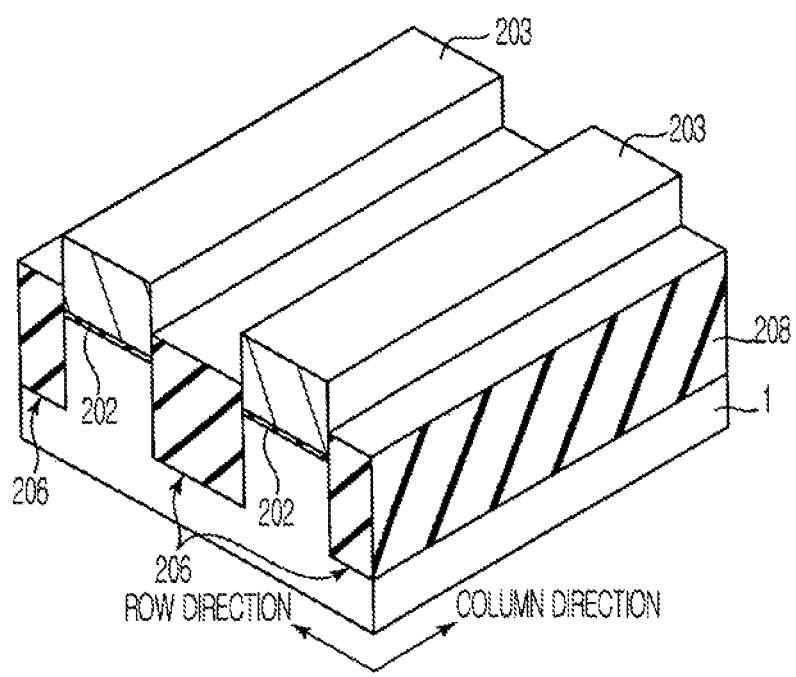
FIG. 12G is a perspective view of a semiconductor device during a manufacturing process.

Next, as shown in FIG. 12G, the silicon oxide film 208 is additionally etched back to expose a side surface of the first boron-containing polysilicon film 203 out of the silicon oxide film 208.

Figure 12H:
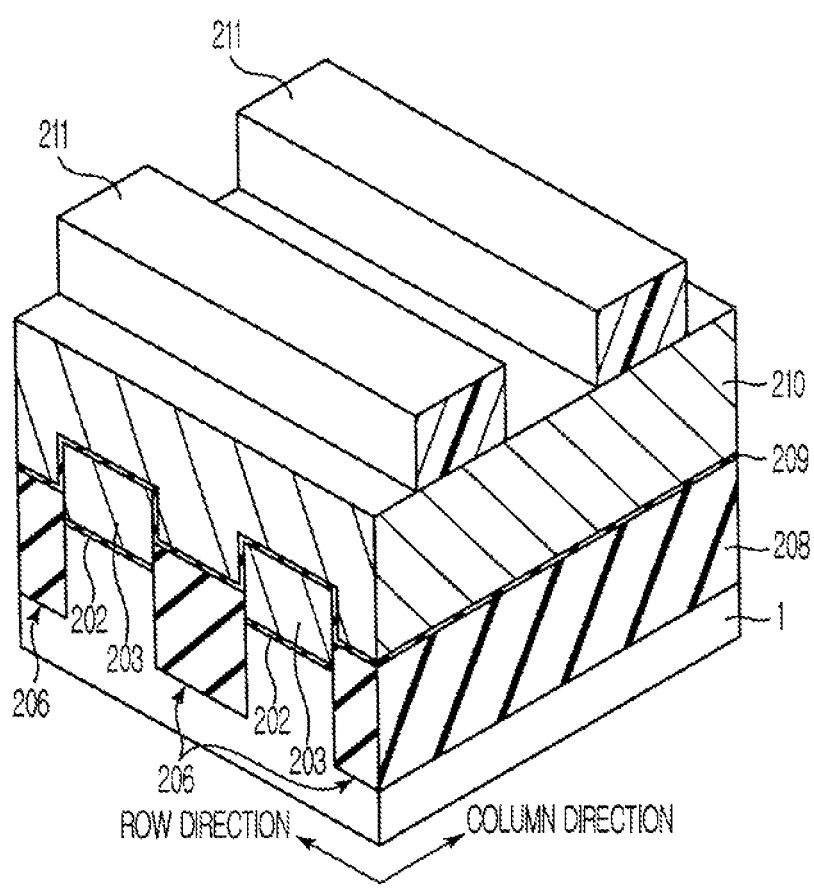
FIG. 12H is a perspective view of a semiconductor device during a manufacturing process.

Next, as shown in FIG. 12H, an inter-gate insulating film 209 for capacity coupling a floating gate electrode and a control gate electrode to each other is formed on the first boron-containing polysilicon film 203 and the silicon oxide film 208. In addition, a conductive material forming the control gate electrode, for example, boron-containing silicon, is deposited on the inter-gate insulating film 209 to form a second boron-containing polysilicon film 210. Then, the photoresist is applied on the second boron-containing polysilicon film 210 to form a photoresist film 211. In addition, the photoresist film 211 is patterned by using a photolithography method to correspond to a pattern of the control gate electrode.

Figure 12I:
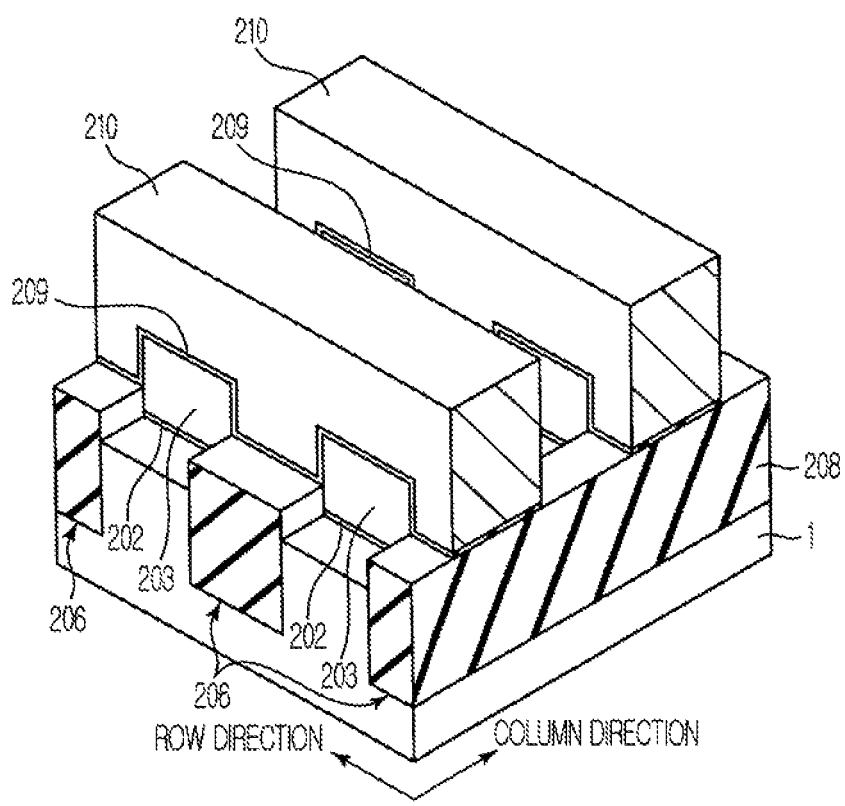
FIG. 12I is a perspective view of a semiconductor device during a manufacturing process.

Next, as shown in FIG. 12I, the second boron-containing polysilicon film 210, the inter-gate insulating film 209, the first boron-containing polysilicon film 203, and the tunnel oxide film 202 are etched by using the photoresist film 211 as a mask. Accordingly, the second boron-containing polysilicon film 210, the inter-gate insulating film 209, the first boron-containing polysilicon film 203, and the tunnel oxide film 202 are isolated along a row direction that crosses the column direction, for example, perpendicularly to the column direction.

Next, as shown in FIG. 12I, the photoresist film 211 is removed.

Figure 14A:
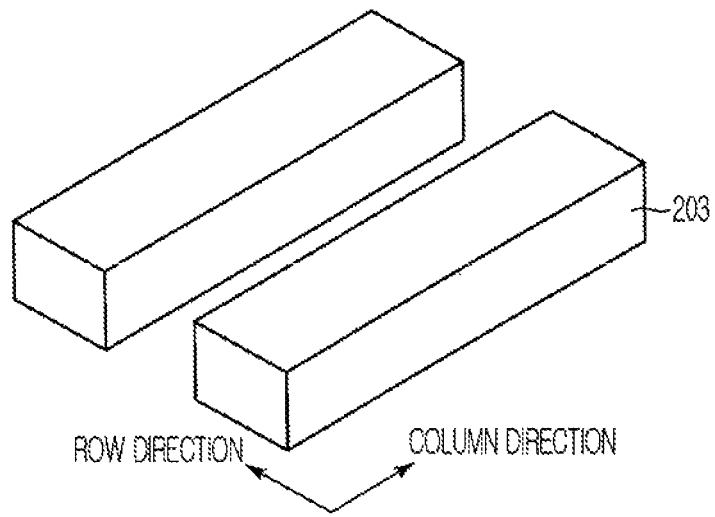
FIG. 14A is a perspective view showing an etched state of a first boron-containing polysilicon film.
Figure 14B:
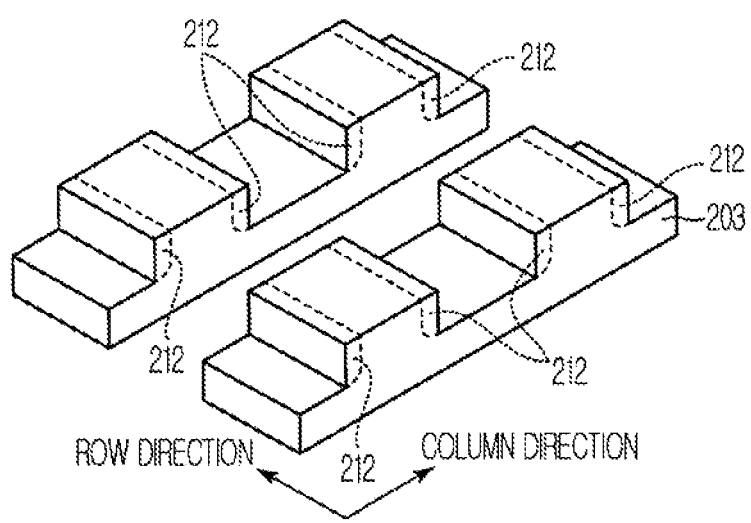
FIG. 14B is a perspective view showing an etched state of a first boron-containing polysilicon film.
Figure 14C:
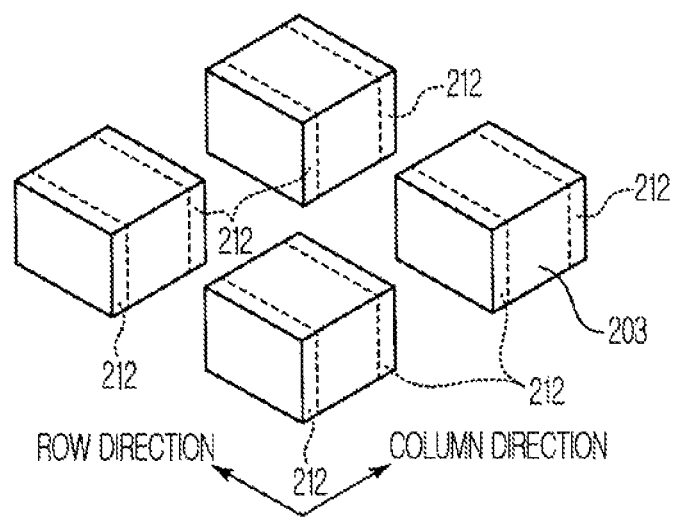
FIG. 14C is a perspective view showing an etched state of a first boron-containing polysilicon film.

FIGS. 14A through 14C are perspective views showing the first boron-containing polysilicon film 203 that is in the process of being etched.

Figure 12J:
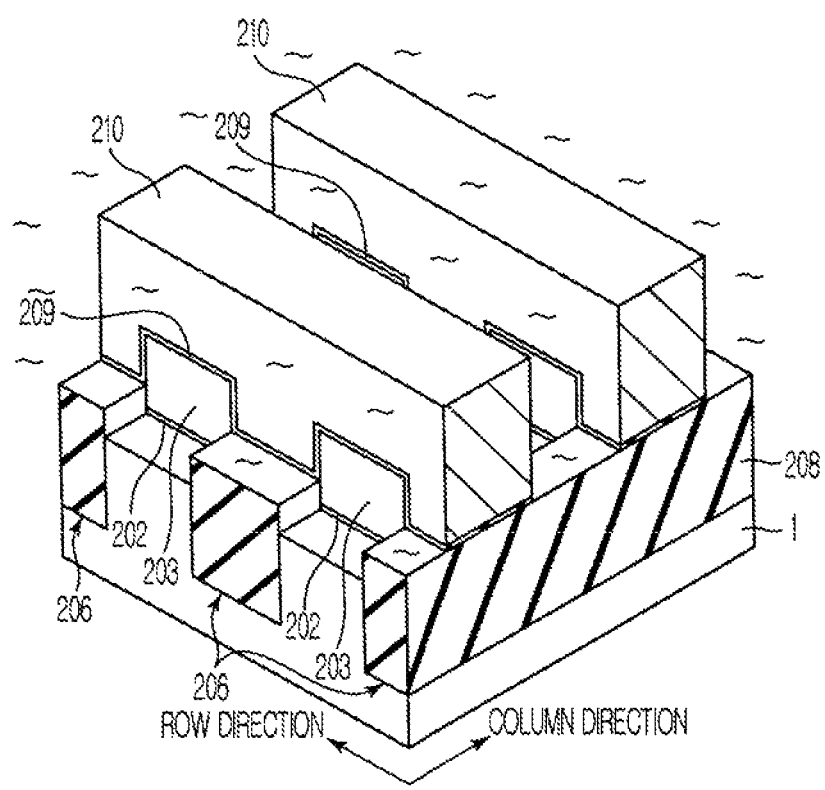
FIG. 12J is a perspective view of a semiconductor device during a manufacturing process.

As shown in FIGS. 14A through 14C, when the first boron-containing polysilicon film 203 is etched to be self-aligned with respect to the second boron-containing polysilicon film 210, the first boron-containing polysilicon film 203 is etched along the row direction. Here, an impurity loss layer 212, in which the impurity, that is, the boron in the present embodiment, is lost, is formed on the etched surface of the first boron-containing polysilicon film 203. Thus, as shown in FIG. 12J, boron is vapor-diffused with respect to the etched surface, and with respect to the impurity loss layer 212. To perform the vapor diffusion of the boron, the impurity diffusion method according to the above embodiments is applied. Accordingly, the lost boron may be compensated for within a short period of time with a high concentration of boron.

Also, in a case where the second boron-containing polysilicon film 210 is used as the conductive film forming the control gate electrode like in the present example, boron may be vapor-diffused with respect to an etched surface of the second boron-containing polysilicon film 210. Accordingly, the lost boron in the second boron-containing polysilicon film 210 may be compensated for within a short period of time with a high concentration of boron.

As described above, the impurity diffusion method according to the present embodiment of the present invention may be applied to the vapor diffusion process in the method of manufacturing the semiconductor device, wherein the manufacturing method includes forming the conductive film on the silicon substrate 1, etching the conductive film, and performing the vapor diffusion of the impurity on the etched surface of the conductive film.

Figure 15:
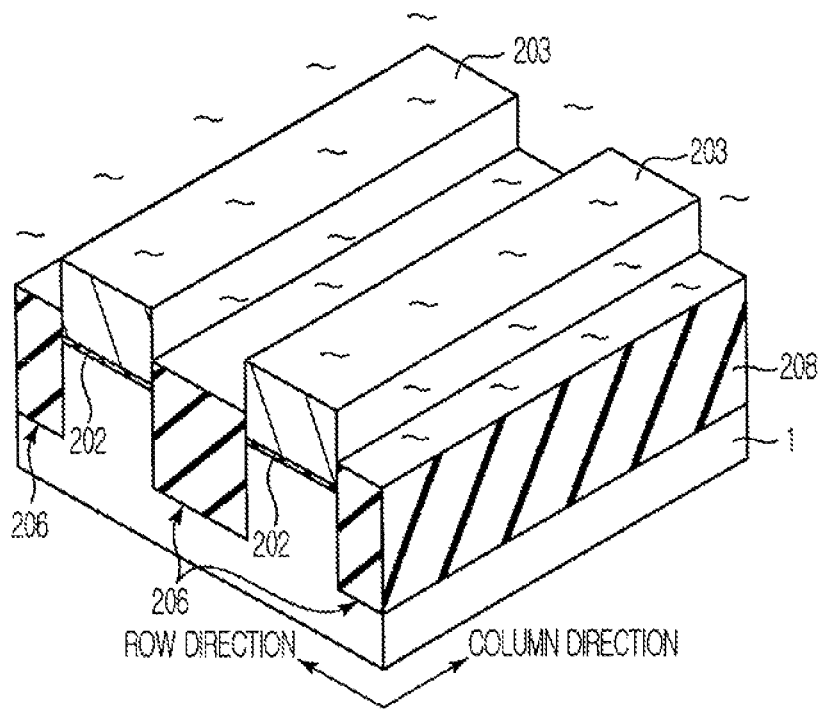
FIG. 15 is a perspective view showing a modified example of a vapor diffusion process.

Also, the vapor diffusion process shown in FIG. 12D may be performed after burying the shallow trench 206 with the silicon oxide film 208 and exposing the side surface of the first boron-containing polysilicon film 203 from the silicon oxide film 208, as shown in FIG. 15.

Also, an impurity diffusion method according to fourth to sixth embodiments of the present invention, which will be described below, may be applied to the vapor diffusion process instead of the impurity diffusion method according to the first through third embodiments.

(Fourth Embodiment)

Figure 16:
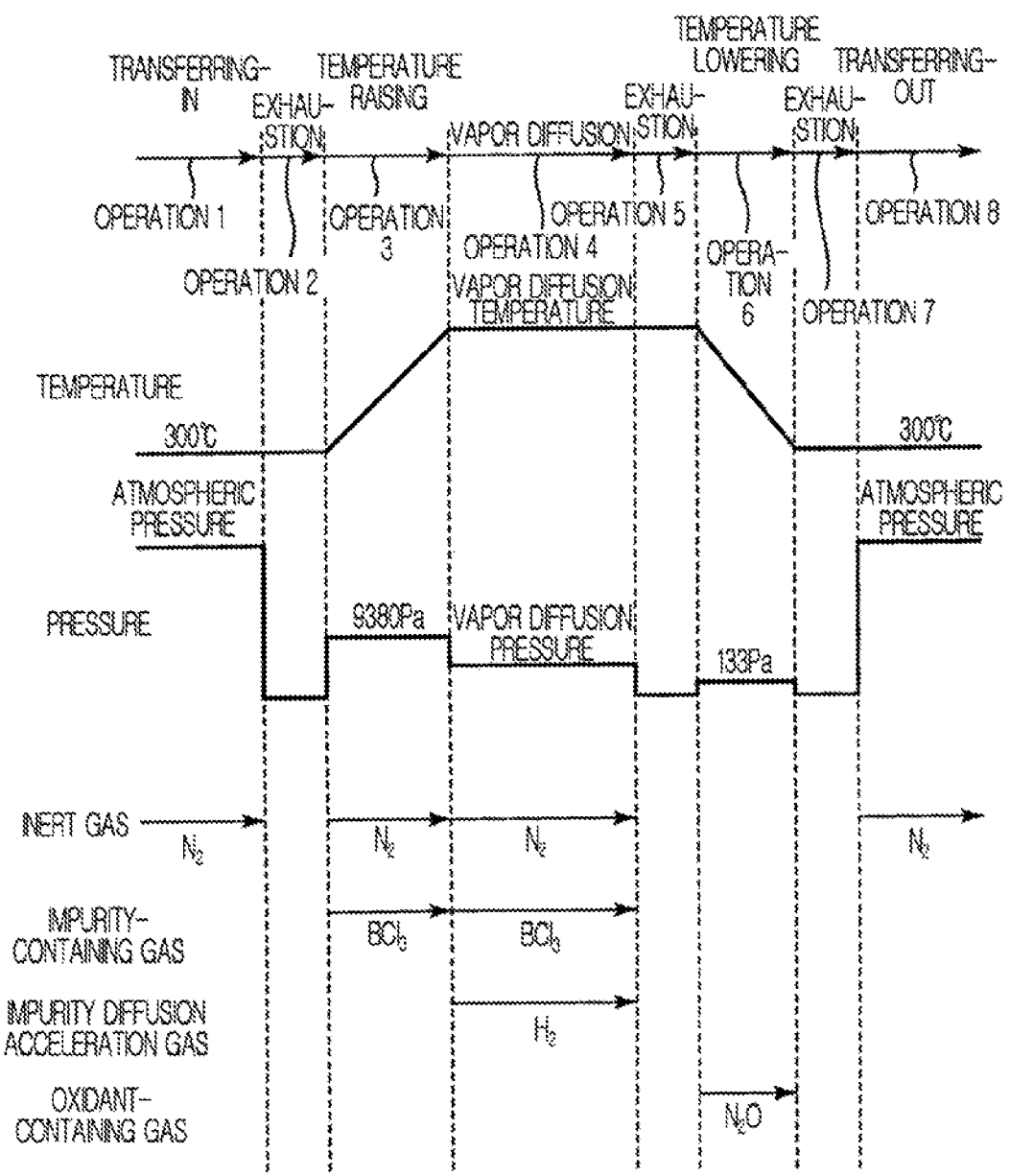
FIG. 16 is a timing diagram showing an impurity diffusion method according to a fourth embodiment of the present invention.

FIG. 16 is a timing diagram showing an impurity diffusion method according to a fourth embodiment of the present invention.

As shown in FIG. 16, the impurity diffusion method according to the fourth embodiment is different from that of the first embodiment in that the impurity diffusion acceleration gas, for example, the hydrogen gas, is not supplied into the processing chamber in the temperature raising process of operation 3.

Examples of supply amounts of the inert gas and the impurity-containing gas in the temperature raising process (operation 3) are as follows.

Inert gas ($N_2$): 500 sccm
Impurity-containing gas ($BCl_3$(1%)): 100 sccm

Also, examples of supply amounts of the inert gas, the impurity-containing gas, and the impurity diffusion acceleration gas in the vapor diffusion process (operation 4) are as follows.

Inert gas ($N_2$): 500 sccm
Impurity-containing gas ($BCl_3$(1%)): 100 sccm
Impurity diffusion acceleration gas ($H_2$): 100 sccm As shown in the fourth embodiment, the impurity diffusion acceleration gas may be supplied only in the vapor diffusion process of operation 4. In this case, since the impurity diffusion acceleration gas, for example, the hydrogen gas, is in the processing chamber, the impurity, for example, boron, may be diffused into the polysilicon 3 with a higher concentration per unit time, compared with a case where the impurity diffusion acceleration gas is not supplied.

(Fifth Embodiment)

Figure 17:
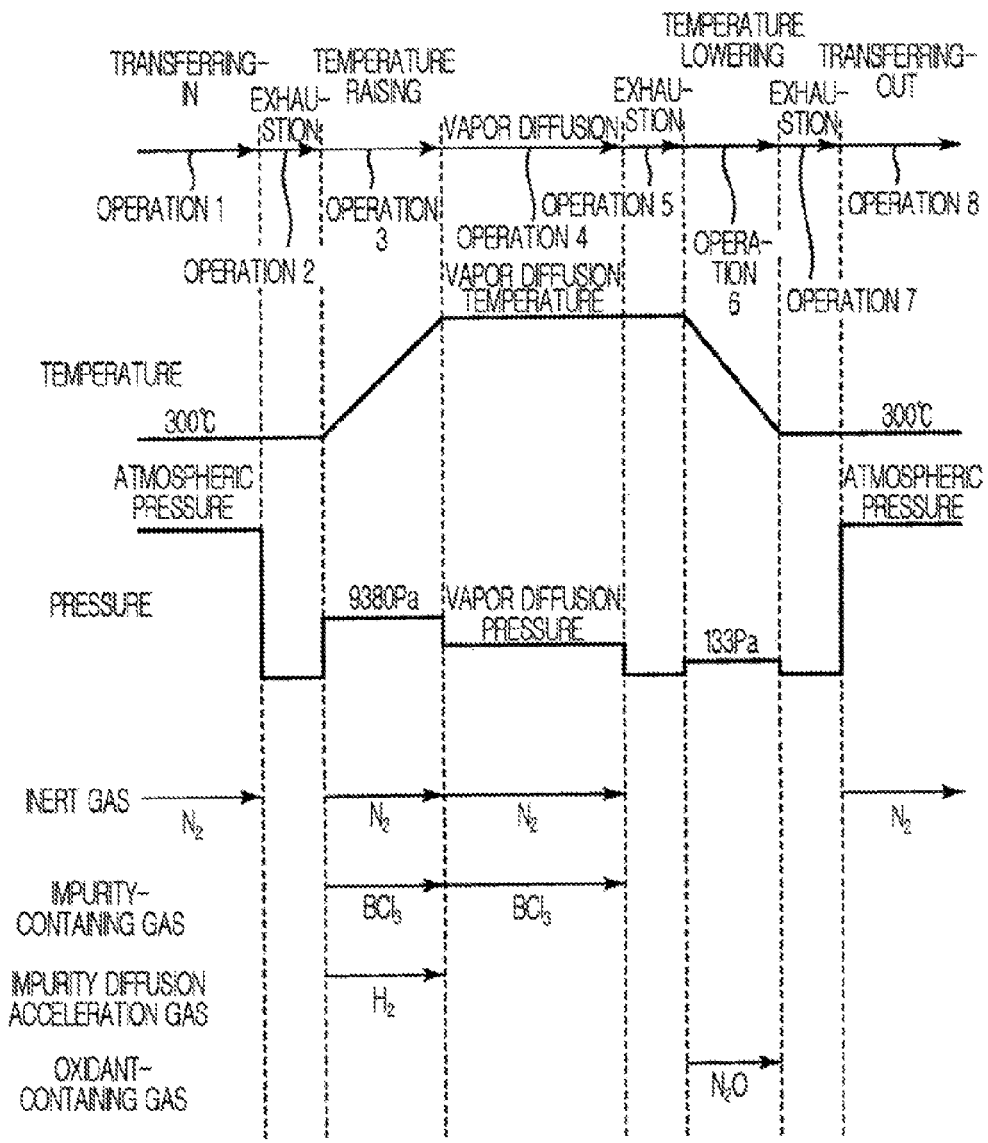
FIG. 17 is a timing diagram showing an impurity diffusion method according to a fifth embodiment of the present invention.

FIG. 17 is a timing diagram showing an impurity diffusion method according to fifth embodiment of the present invention.

As shown in FIG. 17, the impurity diffusion method according to the fifth embodiment is different from that of the first embodiment shown in FIG. 1 and the like in that the impurity diffusion acceleration gas, for example, the hydrogen gas, is not supplied into the processing chamber in the vapor diffusion process of operation 4.

Examples of supply amounts of the inert gas, the impurity-containing gas, and the impurity diffusion acceleration gas in the temperature raising process (operation 3) are as follows.

Inert gas ($N_2$): 500 sccm
Impurity-containing gas ($BCl_3$ (1%)): 100 sccm
Impurity diffusion acceleration gas ($H_2$): 100 sccm Also, examples of supply amounts of the inert gas and the impurity-containing gas in the vapor diffusion process (operation 4) are as follows.

Inert gas ($N_2$): 500 sccm
Impurity-containing gas ($BCl_3$ (1%)): 100 sccm

As shown in the fifth embodiment, the impurity diffusion acceleration gas may be supplied only in the temperature raising process of operation 3. In this case, the impurity diffusion gas may be a reducing gas, like in the third embodiment.

(Sixth Embodiment)

Figure 18:
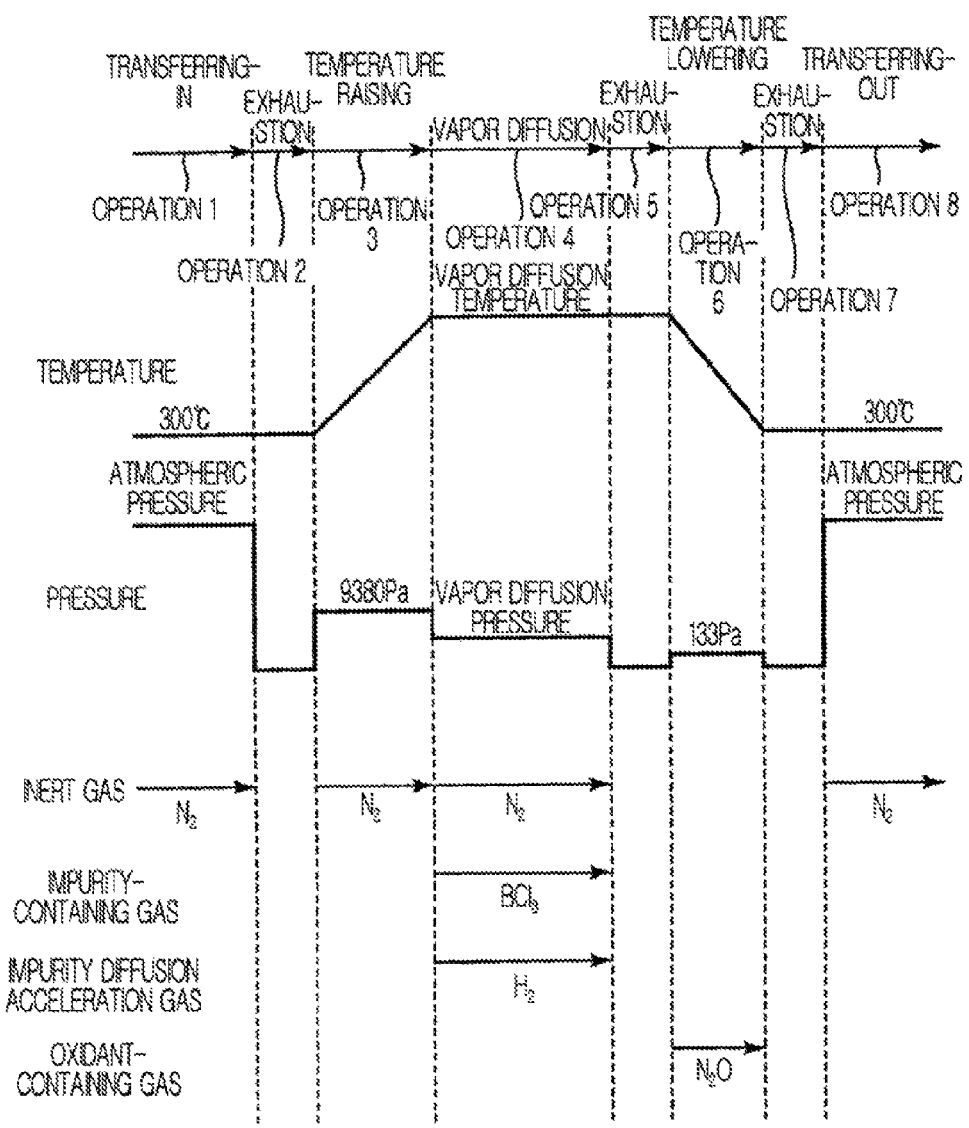
FIG. 18 is a timing diagram showing an impurity diffusion method according to a sixth embodiment of the present invention.

FIG. 18 is a timing diagram showing an impurity diffusion method according to sixth embodiment of the present invention.

As shown in FIG. 18, the impurity diffusion method according to the sixth embodiment is different from that of the first embodiment shown in FIG. 1 and the like in that the impurity-containing gas and the impurity diffusion acceleration gas are only supplied into the processing chamber in the vapor diffusion process of operation 4.

An example of a supply amount of the inert gas in the temperature raising process (operation 3) is as follows.

Inert gas ($N_2$): 500 sccm

Also, examples of supply amounts of the inert gas, the impurity-containing gas, and the impurity diffusion acceleration gas in the vapor diffusion process (operation 4) are as follows.

Inert gas ($N_2$): 500 sccm
Impurity-containing gas ($BCl_3$ (1%)): 100 sccm
Impurity diffusion acceleration gas ($H_2$): 100 sccm As shown in the sixth embodiment, the impurity-containing gas and the impurity diffusion acceleration gas may be supplied only in the vapor diffusion process of operation 4. In this case, the impurity, for example, boron, may be diffused into the polysilicon 3 with a higher concentration per unit time, compared with a case where the impurity diffusion acceleration gas is not supplied.

Although the present invention is described according to the above embodiments, the present invention is not limited thereto, but can be modified within the scope of the invention.

For example, in the above embodiments, examples of the processing conditions are recited; however, the processing conditions are not limited to the above examples.

The impurity-containing gas is not limited to the boron trichloride, but diborane ($B_2H_6$) or the like may be used as the impurity-containing gas.

Also, in the oxidation process, any of ozone oxidation using an ozone gas and radical oxidation using oxygen radicals may be used instead of the oxidation using the oxygen gas. Likewise, in the nitridation process, radical nitridation using ammonia radicals may be used, instead of the nitridation using the ammonia gas.

Otherwise, the present invention can be variously modified within the scope of the invention.

According to the present invention, the impurity diffusion method capable of vapor-diffusing impurities at a higher concentration within a shorter period of time into the thin film, the substrate processing apparatus capable of executing the impurity diffusion method, and the method of manufacturing the semiconductor device by using the impurity diffusion method are provided.

While this invention has been particularly shown and described with reference to exemplary embodiments thereof, it will be understood by those of ordinary skill in the art that various changes in form and details may be made therein without departing from the spirit and scope of the invention as defined by the appended claims.

What is claimed is:

1. An impurity diffusion method for diffusing impurities into a thin film, the method comprising:
transferring an object, on which the thin film is formed, into a processing chamber;

raising a temperature of the object to a vapor diffusion temperature in the processing chamber, wherein the temperature of the object is greater than 500° C. and less than 700° C.; and diffusing the impurities into the thin film formed on the object of which the temperature is raised to the vapor diffusion temperature by supplying an impurity-containing gas that contains the impurities into the processing chamber together with an inert gas, wherein in the diffusing of the impurities, an impurity diffusion acceleration gas for accelerating the diffusion of the impurities into the thin film is supplied into the processing chamber together with the impurity-containing gas and the inert gas, wherein the impurities lost from an etched surface of the thin film during etching of the thin film or the impurities lost from an oxidized surface of the thin film during oxidizing of the thin film are compensated by supplying the impurity diffusion acceleration gas.

2. The method of claim 1, wherein if the impurity diffusion acceleration gas additionally has a reducing operation, in the raising of the temperature of the object, the impurity diffusion acceleration gas is supplied together with the inert gas so as to reduce a native oxide film existing on a surface of the thin film formed on the object while raising the temperature of the object.

3. The method of claim 1, wherein in the raising of the temperature of the object, the impurity-containing gas is supplied into the processing chamber together with the inert gas.

4. The method of claim 1, wherein the thin film is a thin film including silicon.

5. The method of claim 1, wherein the impurities are boron.

6. The method of claim 1, wherein the impurity diffusion acceleration gas is hydrogen.

7. The method of claim 1, further comprising lowering the temperature of the object on which the thin film is formed, to a temperature in which the object is able to be transferred from the processing chamber, in the processing chamber, wherein in the lowering of the temperature of the object, an oxidant-containing gas is supplied into the processing chamber so as to oxidize a surface of the thin film, in which the impurities are diffused, while lowering the temperature of the object.

8. An impurity diffusion method for diffusing impurities into a thin film, the method comprising:

transferring an object, on which the thin film is formed, into a processing chamber;

raising a temperature of the object to a vapor diffusion temperature in the processing chamber, wherein the temperature of the object is greater than 500° C. and less than 700° C.; and diffusing the impurities into the thin film formed on the object of which the temperature is raised to the vapor diffusion temperature by supplying an impurity-containing gas that contains the impurities into the processing chamber together with an inert gas, wherein in the raising of the temperature of the object, a reducing gas having a reducing function is supplied into the processing chamber, together with the inert gas so that a native oxide film existing on a surface of the thin film that is formed on the object is reduced while raising the temperature of the object, wherein the impurities lost from an etched surface of the thin film during etching of the thin film or the impurities lost from an oxidized surface of the thin film during oxidizing of the thin film are compensated by supplying the reducing gas.

9. The method of claim 8, wherein the impurity-containing gas is additionally supplied into the processing chamber in the raising of the temperature of the object.

10. The method of claim 8, wherein the thin film is a thin film including silicon.

11. The method of claim 8, wherein the impurities are boron.

12. The method of claim 8, wherein the reducing gas is hydrogen.

13. The method of claim 8, further comprising lowering the temperature of the object on which the thin film is formed to a temperature in which the object is able to be transferred from processing chamber, in the processing chamber, wherein in the lowering of the temperature of the object, an oxidant-containing gas is supplied into the processing chamber so as to oxidize a surface of the thin film, in which the impurities are diffused, while lowering the temperature of the object.

14. A method of manufacturing a semiconductor device, the method comprising:

forming a conductive film on a semiconductor substrate;

etching the conductive film; and performing vapor diffusion of impurities on an etched surface of the conductive film, wherein the performing of vapor diffusion of impurities is performed by using the impurity diffusion method according to claim 1.

* * * * *